(12) United States Patent
Birchall et al.

(10) Patent No.: US 11,733,112 B2
(45) Date of Patent: Aug. 22, 2023

(54) CHARACTERIZATION OF FORCE-SENSOR EQUIPPED DEVICES

(71) Applicant: Cirrus Logic International Semiconductor Ltd., Edinburgh (GB)

(72) Inventors: Tom Birchall, London (GB); Hamid Sepehr, London (GB); Colin Campbell, Austin, TX (US); Jason Kulpe, Austin, TX (US); Chin Yong, Austin, TX (US); Pablo Peso Parada, London (GB)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 17/218,322

(22) Filed: Mar. 31, 2021

(65) Prior Publication Data

US 2022/0316969 A1   Oct. 6, 2022

(51) Int. Cl.
  *G06F 3/04886* (2022.01)
  *G06F 3/041* (2006.01)
  *G01L 5/16* (2020.01)

(52) U.S. Cl.
  CPC .............. *G01L 5/16* (2013.01); *G06F 3/0414* (2013.01); *G06F 3/04886* (2013.01)

(58) Field of Classification Search
  None
  See application file for complete search history.

(56) References Cited

U.S. PATENT DOCUMENTS 10,860,202 B2   12/2020   Sepehr et al.
10,955,955 B2   3/2021   Peso Parada et al.
(Continued)

FOREIGN PATENT DOCUMENTS

WO   2014018086 A1   1/2014
WO   2016164193 A1   10/2016

OTHER PUBLICATIONS

Boser, B. E., Guyon, I.M., Vapnik, V.N., "A training algorithm for optimal margin classifiers". In Proceedings of the fifth annual workshop on Computational learning theory (pp. 144-152). Jul. 1992.
(Continued)

*Primary Examiner* — William L Bashore
*Assistant Examiner* — Gabriel Mercado
(74) *Attorney, Agent, or Firm* — Jackson Walker L.L.P

(57) ABSTRACT

A method of recording measurement data for characterizing a response of a given type of device to an applied force, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising: for a specimen device of the given type, performing at least one measurement procedure, each measurement procedure comprising at least one measurement operation, each measurement operation comprising applying a defined force at a corresponding location on the input region of the device concerned and recording measurement data for that device and location based on the sensor signals of the N force sensors of that device. Also disclosed are a related computer-implemented method of generating a characterization definition for devices of the given type, a computer-implemented method of generating a configuration definition for devices of the given type for a given use case defined by a use-case definition, a method of configuring a candidate device of the given type for the given use case, and a method of assessing or calibrating a candidate device of the given type.

13 Claims, 18 Drawing Sheets

(56) References Cited

U.S. PATENT DOCUMENTS

| | | | |
|---|---|---|---|
| 2003/0214485 A1 | 11/2003 | Roberts | |
| 2009/0270078 A1* | 10/2009 | Nam ................. | H04M 1/72406 |
| | | | 455/566 |
| 2010/0134424 A1 | 6/2010 | Brisebois et al. | |
| 2012/0105368 A1* | 5/2012 | Kobayashi ............ | G06F 3/0416 |
| | | | 345/174 |
| 2013/0222247 A1* | 8/2013 | Liu ..................... | G06F 3/04886 |
| | | | 345/168 |
| 2014/0078047 A1* | 3/2014 | Seo ...................... | G06F 3/0487 |
| | | | 345/156 |
| 2014/0146020 A1* | 5/2014 | An ..................... | G06F 3/04166 |
| | | | 345/175 |
| 2015/0346897 A1* | 12/2015 | Irri ..................... | G06F 3/04186 |
| | | | 345/175 |
| 2017/0024061 A1* | 1/2017 | Forlines ................ | G06F 3/0446 |
| 2018/0329718 A1* | 11/2018 | Klein ................... | G06F 1/1647 |
| 2019/0064984 A1* | 2/2019 | Schwartz ............ | G06F 3/04883 |
| 2020/0313672 A1 | 10/2020 | Peso Parada et al. | |
| 2021/0337555 A1* | 10/2021 | Fan ...................... | H04W 28/24 |

OTHER PUBLICATIONS

Peso Parada, Pablo et al., U.S. Appl. No. 62/915,245, Temperature Compensation for Force Sensing, filed Oct. 15, 2019.
Peso Parada, Pablo et al., U.S. Appl. No. 17/128,922, Baseline Signal Calculation, filed Dec. 21, 2020.
Combined Search and Examination Report under Sections 17 and 18(3), UKIPO, Application No. GB2204395.4, dated Aug. 17, 2022.
Examination Report under Section 18(3), UKIPO, Application No. GB2204395.4, dated Dec. 19, 2022.

* cited by examiner

Fig. 2
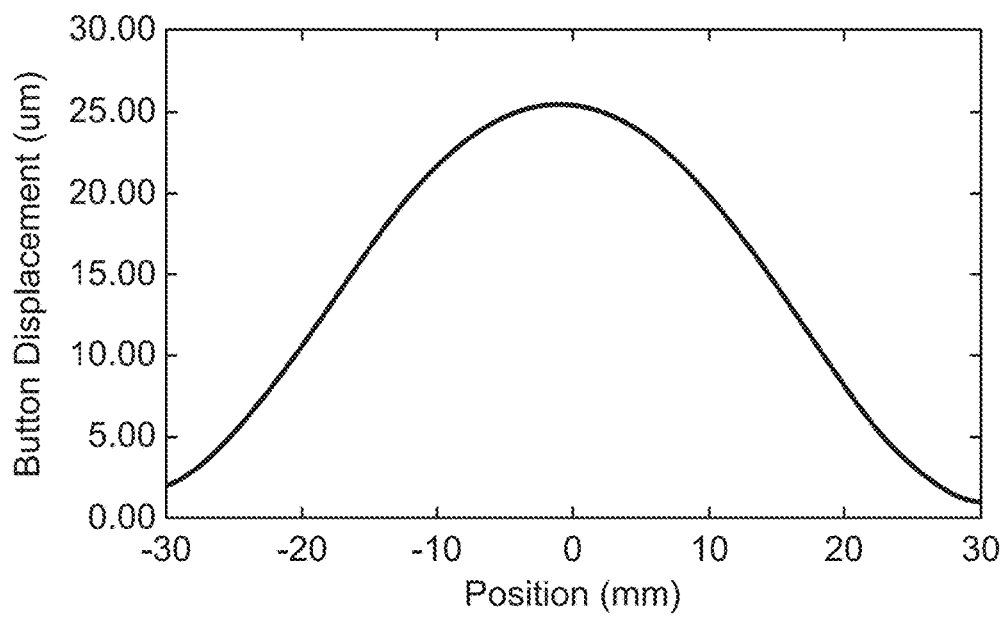
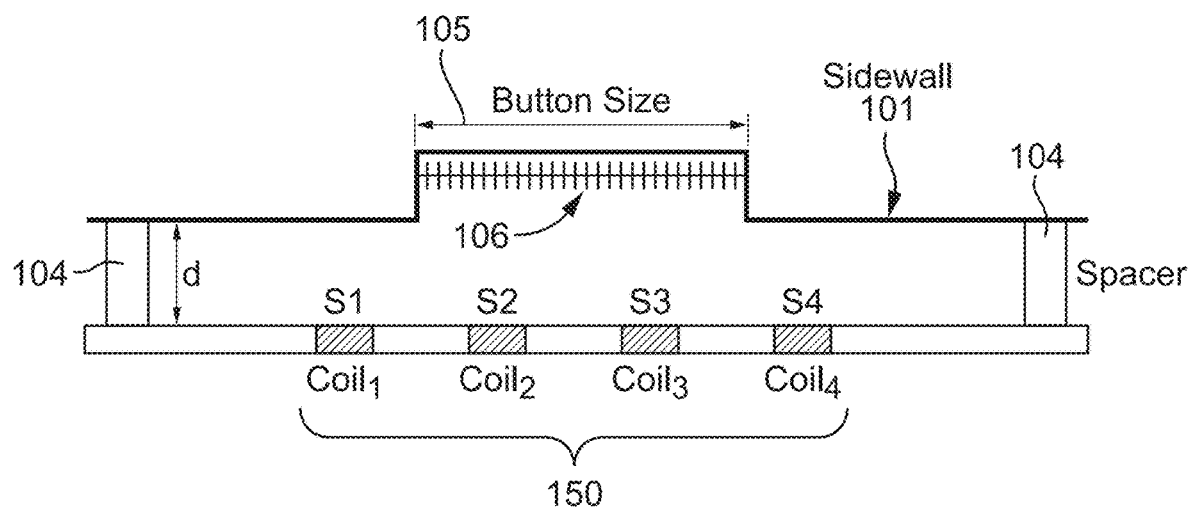

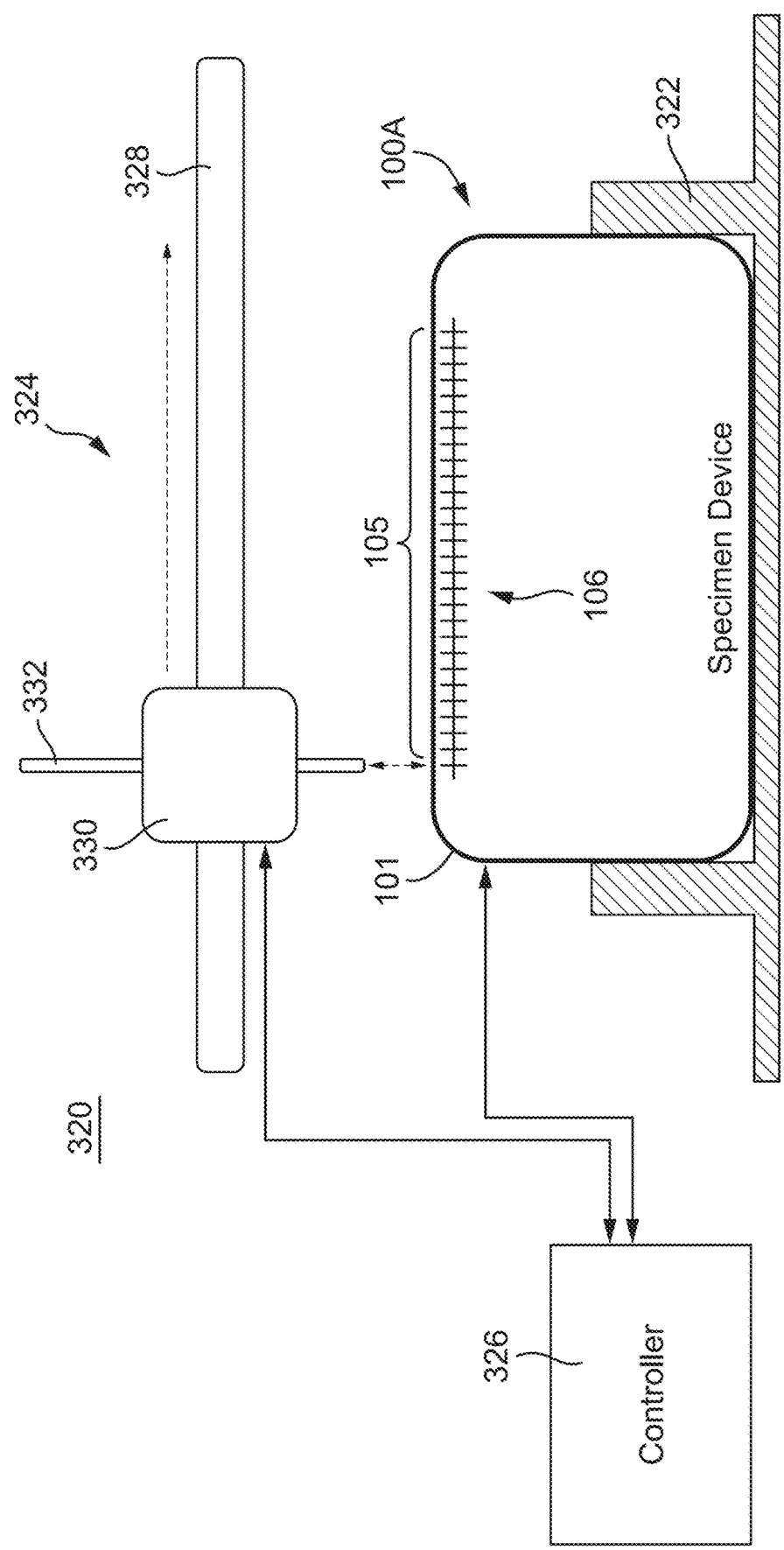

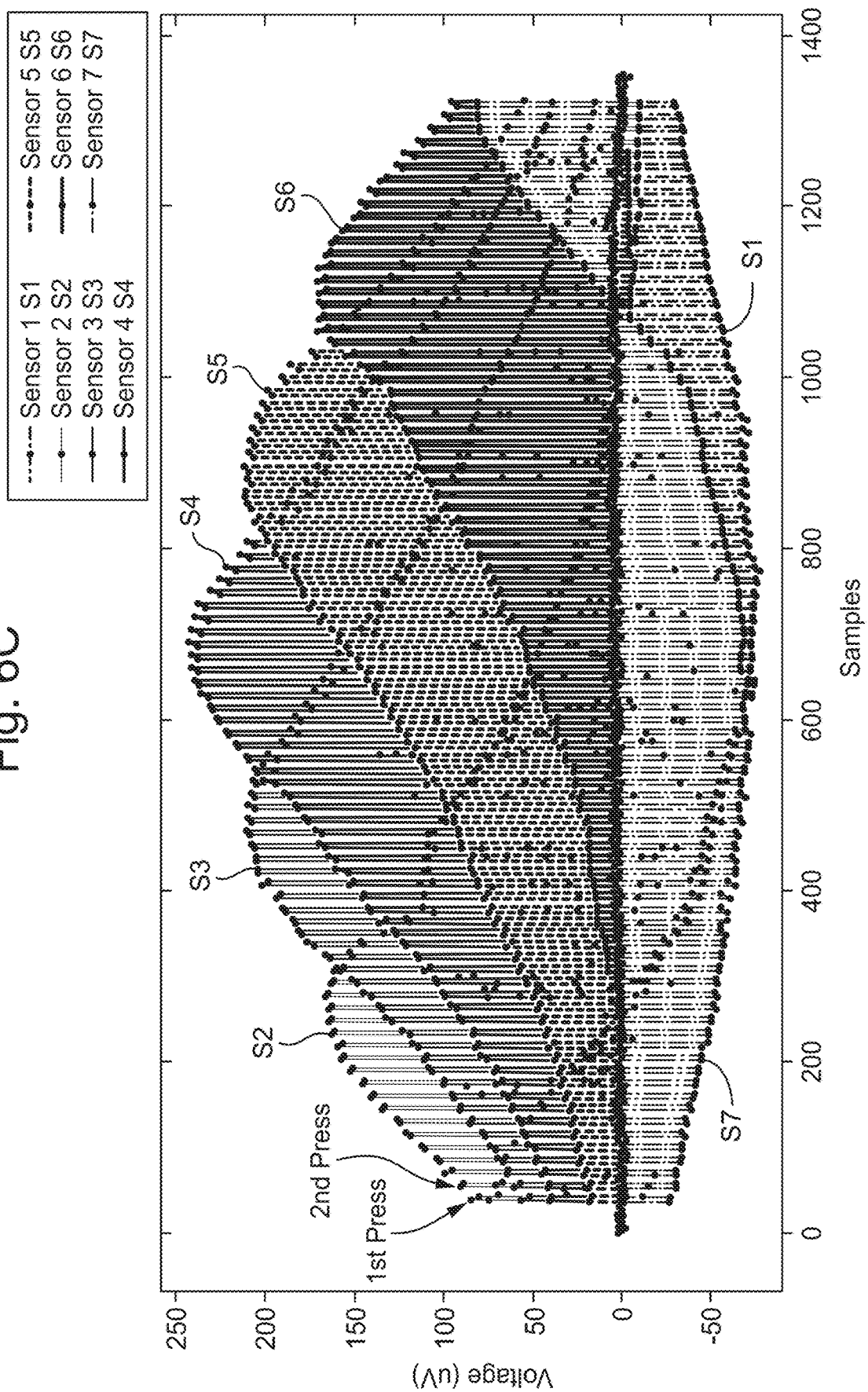

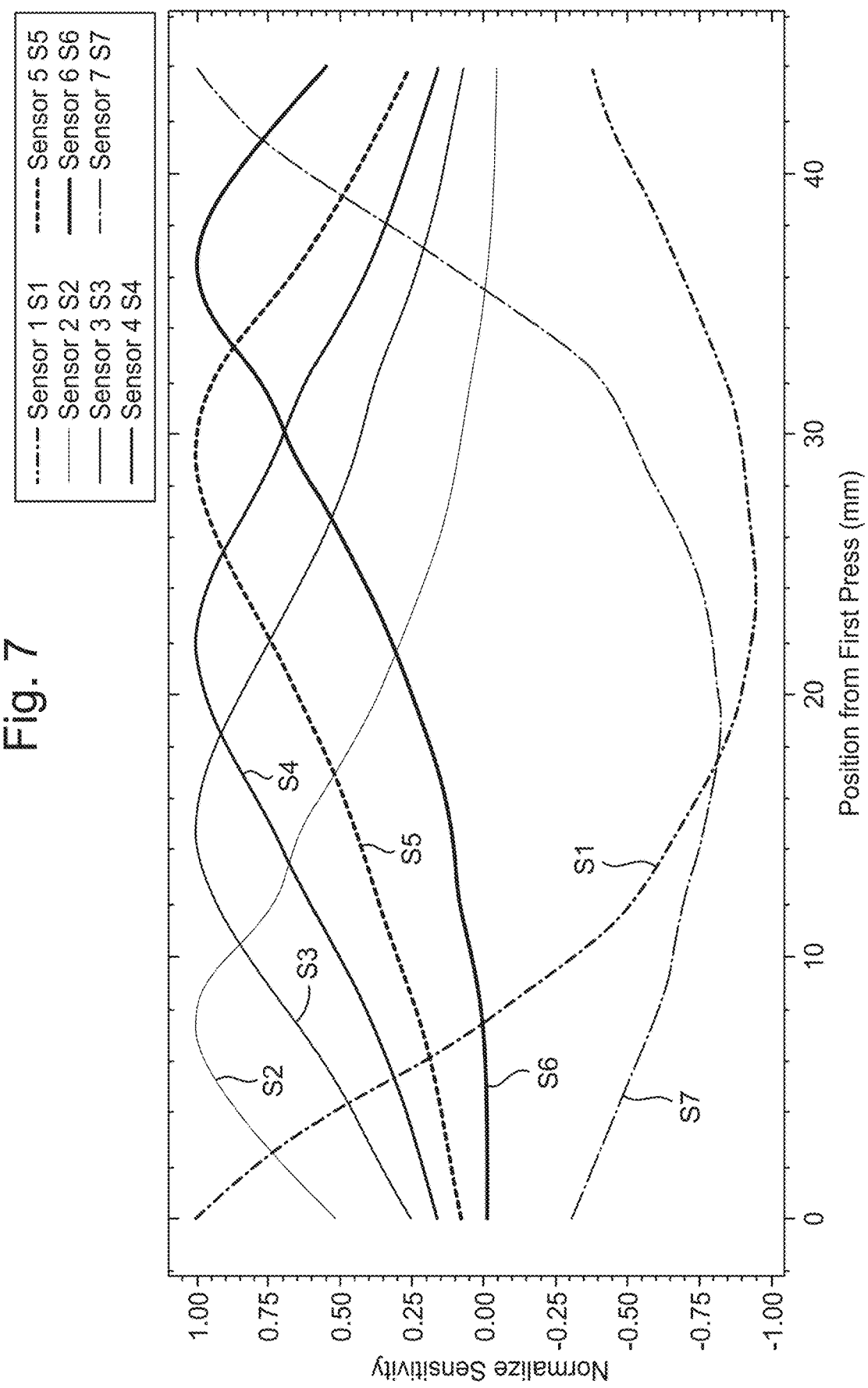

Fig. 8

|        | S1 Sensor 1 | S2 Sensor 2 | S3 Sensor 3 | S4 Sensor 4 | S5 Sensor 5 | S6 Sensor 6 | S7 Sensor 7 |
|--------|-------------|-------------|-------------|-------------|-------------|-------------|-------------|
| Sensor 1 | 1 | 0.52 | 0.26 | 0.16 | 0.076 | -0.015 | -0.31 |
| Sensor 2 | -0.015 | 1 | 0.66 | 0.39 | 0.22 | 0.0024 | -0.6 |
| Sensor 3 | -0.67 | 0.64 | 1 | 0.72 | 0.44 | 0.11 | -0.77 |
| Sensor 4 | -0.94 | 0.28 | 0.73 | 1 | 0.75 | 0.33 | -0.8 |
| Sensor 5 | -0.9 | 0.08 | 0.44 | 0.72 | 1 | 0.66 | -0.54 |
| Sensor 6 | -0.68 | -0.015 | 0.23 | 0.4 | 0.64 | 1 | 0.11 |
| Sensor 7 | -0.38 | -0.048 | 0.71 | 0.16 | 0.026 | 0.55 | 1 |

Cross Talk Matrix Between Sensors

Fig. 9

$$z(n) = y(n) \cdot \mathbf{S2B}$$
$$(1 \times M) \quad (1 \times N) \quad (N \times M)$$

$$\mathbf{S2B} = \begin{bmatrix} s2b_{11} & s2b_{12} & \cdots & s2b_{1M} \\ \vdots & \ddots & \ddots & \vdots \\ s2b_{N1} & \cdots & \cdots & s2b_{NM} \end{bmatrix}$$

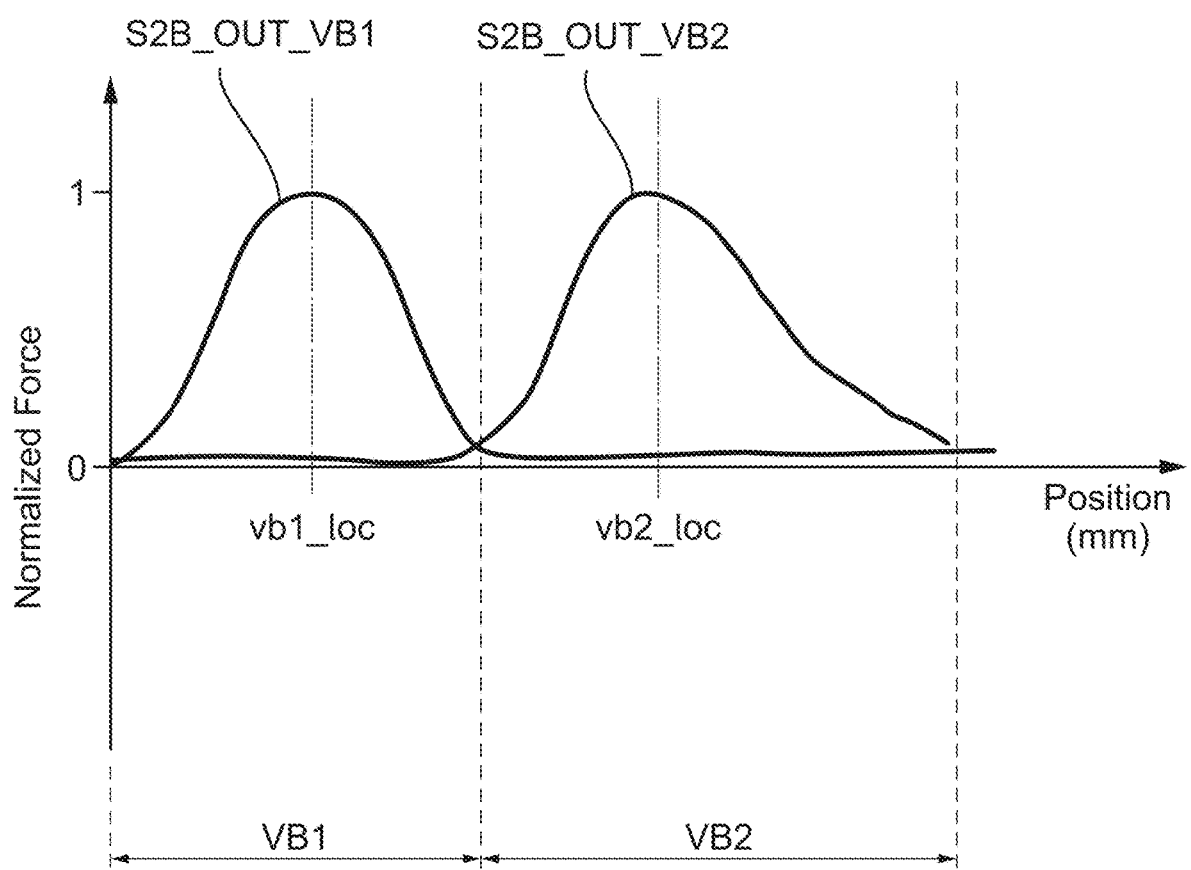

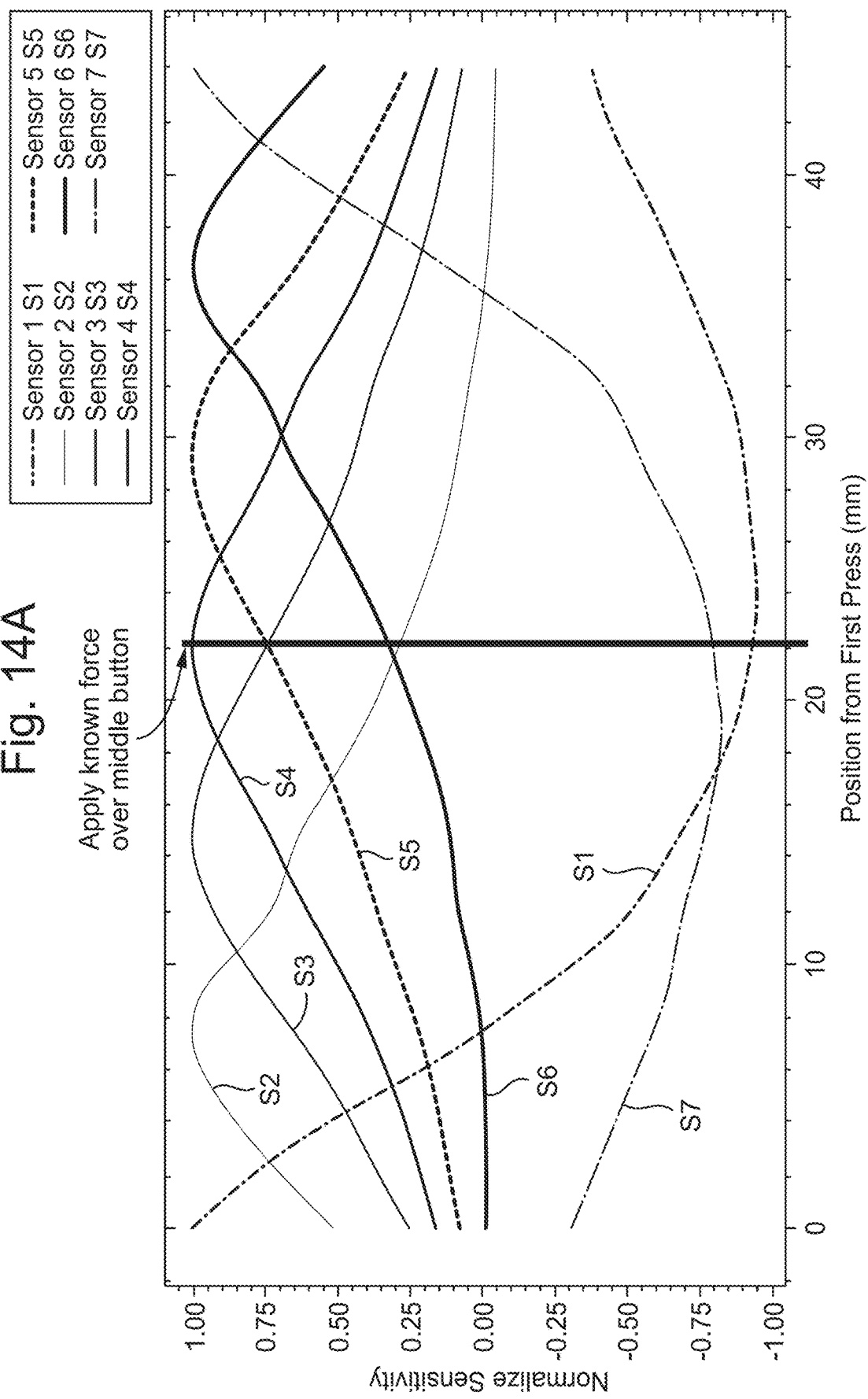

CHARACTERIZATION OF FORCE-SENSOR EQUIPPED DEVICES

FIELD OF DISCLOSURE

The present disclosure relates to characterization of force-sensor equipped devices.

In particular, the present disclosure relates to recording measurement data for characterizing a response of a given type of device to an applied force, generating a characterization definition which defines a response of the given type of device to an applied force, generating a configuration definition for configuring the given type of device for a given use case defined by a use-case definition, and configuring a candidate device of the given type for the given use case.

The present disclosure also relates to assessing and/or calibrating a candidate device of the given type.

BACKGROUND

Force sensors may be provided for use with, or as part of, a host device. A host device having force sensors may be referred to as a sensor system or force sensor system.

In this context, a host device may be considered an electrical or electronic device and may be a mobile device. Example devices include a portable and/or battery powered host device such as a mobile telephone or smartphone, an audio player, a video player, a PDA (personal digital assistant), a mobile computing platform such as a laptop computer or tablet and/or a games device.

In general, a force sensor is configured to output a sensor sign indicative of a temporary mechanical distortion of a material under an applied force. The material may for example be a metal plate which is part of, or associated with, the force sensor, and which is pushed/pressed or otherwise deformed by a user. In the context of a host device, the material may be part of a chassis or external casing of the device. The force may for example be applied and subsequently reduced or removed in a user press operation, referred to as a button press where the force sensor is used to implement a button, the user press operation starting when the force (e.g. greater than a device defined threshold) is applied.

Force sensing may be carried out by a variety of different types of force sensor. Example types of force sensor include capacitive displacement sensors, inductive force sensors, strain gauges, piezoelectric force sensors, force sensing resistors, piezoresistive force sensors, thin film force sensors and quantum tunnelling composite-based force sensors. Force sensor systems having multiple force sensors may comprise a mixture of types of sensor/sensor technology.

Modern electronic devices are increasingly using "virtual button" technology to replace traditional push buttons. An example is the volume or power button on the side of a smartphone. The traditional buttons have contacts that can age and wear, and virtual buttons not only avoid this problem, but can be made without introducing openings in the smartphone chassis, thus increasing waterproofing and reducing general exposure to dirt and grease.

To replace physical buttons, virtual buttons are implemented using a number of force sensors in a force sensor system as described above. In the context of a smartphone, as a convenient running example of a host device, a number of such sensors may be arranged on the inside of the chassis (on any of the sides)—e.g. on the inside left-side and/or right-side edges or on the front or back of the device. The sensors are then responsive to physical pressure applied to the chassis.

Generally, the objective is to define a certain region of the device chassis as corresponding to a virtual button, and to use sensor information to determine when that region of the chassis has enough applied force to constitute an associated button press. Often multiple regions are defined corresponding respectively to multiple virtual buttons.

Such devices may typically be of a given type. In general, a given type may define devices of that type as comprising a defined arrangement of a surface (of the device, such as a chassis or chassis portion) and N force sensors of the device concerned, where N≥1, each force sensor configured to output a sensor signal. In the defined arrangement, the N force sensors may be operatively coupled to a defined input region of the surface so as to sense a force applied to that input region.

In general, the N sensors may be arranged at various locations on the inside of the chassis (as defined by the device type), and a use case may specify the implementation of M virtual buttons. That is, it may be desirable to detect M virtual button presses corresponding to M regions on the outside of the chassis. Thus, for a given type and use case, there may be N sensors and M virtual buttons, where N≥1 and M≥1.

A need exists to characterize a response of a given type of such device to an applied force in an efficient way, and to configure, assess and/or calibrate such a device based on the characterization.

It is desirable to address some or all of the above problems, or problems described later herein. It is desirable to provide improved methods and associated computing apparatus, computer programs and computer-readable storage media.

SUMMARY

According to a first aspect of the present disclosure, there is provided a method of recording measurement data for characterizing a response of a given type of device to an applied force, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising: for a specimen device of the given type, performing at least one measurement procedure, each measurement procedure comprising at least one measurement operation, each measurement operation comprising applying a defined force at a corresponding location on the input region of the device concerned and recording measurement data for that device and location based on the sensor signals of the N force sensors of that device.

According to a second aspect of the present disclosure, there is provided a computer-implemented method of generating a characterization definition which defines a response of a given type of device to an applied force, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising: obtaining recorded measurement data for devices of that type; and generating the characterization definition based on the recorded measurement data.

The recorded measurement data may be, or have been, recorded by the method of the aforementioned first aspect.

According to a third aspect of the present disclosure, there is provided a computer-implemented method of generating a configuration definition for configuring a given type of device for a given use case defined by a use-case definition, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising: obtaining a characterization definition for devices of that type; and generating the configuration definition based on the characterization definition and the use-case definition.

The characterization definition may be, or have been, generated by the method of the aforementioned second aspect.

According to a fourth aspect of the present disclosure, there is provided a method of configuring a candidate device of a given type for a given use case defined by a use-case definition, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising: obtaining a configuration definition for configuring devices of the given type for the given use case; and configuring the candidate device with the configuration definition.

The configuration definition may be, or have been, generated by the method of the aforementioned third aspect.

According to a fifth aspect of the present disclosure, there is provided a method of assessing or calibrating a candidate device of a given type, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising: performing at least one measurement operation on the candidate device, the measurement operation comprising applying a defined force at a given location on its input region and recording test data for the candidate device and that location based on the sensor signal of at least one of the N force sensors of the candidate device; and assessing or calibrating the candidate device based on the test data and at least one of: a characterization definition for devices of that type; and a configuration definition for devices of that type.

The characterization definition may be, or have been, generated by the method of the aforementioned second aspect. The configuration definition may be, or have been, generated by the method of the aforementioned third aspect.

Also envisaged are corresponding apparatus (e.g. host device or controller) aspects, computer program aspects and storage medium aspects. Features of one aspect may be applied to another and vice versa.

BRIEF DESCRIPTION OF THE DRAWINGS

Reference will now be made, by way of example only, to the accompanying drawings, of which:

FIG. 2 is a schematic diagram of a portion of the host device of FIG. 1, along with a related graph;

FIG. 6B is a schematic diagram of example measurement apparatus which may be used to implement the method of FIG. 6A;

FIG. 6C is a graph of example recorded measurement data for a measurement procedure performed according to the method of FIG. 6A;

FIG. 7 is a graph showing an example conversion of the measurement data from FIG. 6C to present a continuous characterization function per force sensor;

FIG. 8 is a matrix of example cross-talk parameters, which may be automatically calculated from the recorded measurement data of FIG. 6C, or from FIG. 7;

FIG. 9 presents equations useful for understanding a sensor to button weight matrix S2B;

FIGS. 11A to 11C are graphs useful for understanding example cost functions;

FIGS. 14A and 14B present two graphs each corresponding to that of FIG. 7, useful for understanding the techniques referred to in relation to FIG. 13.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
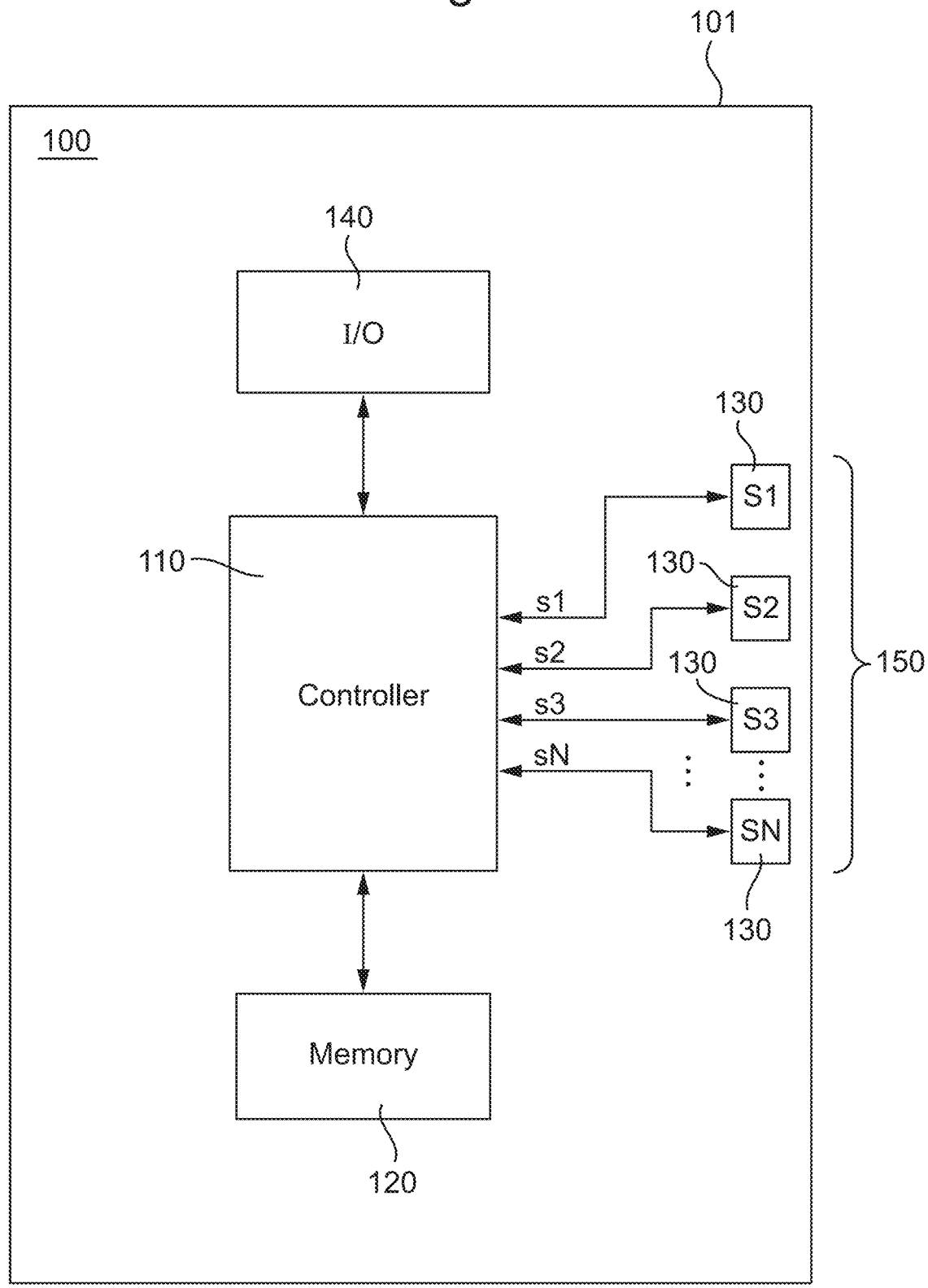
FIG. 1 is a schematic diagram of a host device according to an embodiment.

FIG. 1 is a schematic diagram of a host device 100 according to an embodiment, for example a mobile or portable electrical or electronic device. Example host devices 100 include a portable and/or battery powered host device such as a mobile telephone, a smartphone, an audio player, a video player, a PDA, a mobile computing platform such as a laptop computer or tablet and/or a games device.

As shown in FIG. 1, the host device 100 may comprise an enclosure 101, a controller 110, a memory 120, N force sensors 130, where N≥1, and an input and/or output unit (I/O unit) 140. Although generally herein N≥1 (i.e. one or more), for some arrangements considered herein N>1 (i.e. two or more). For convenience, force sensors 130 will be referred to herein in the plural however it will be recalled that in some arrangements N=1.

The enclosure 101 may comprise any suitable housing, casing, chassis or other enclosure for housing the various components of host device 100, and define an external surface of the host device 100. Enclosure 101 may be constructed from metal, and/or any other suitable materials. In addition, enclosure 101 may be adapted (e.g., sized and shaped) such that host device 100 is readily transported by a user (i.e. a person).

Controller 110 may be housed within enclosure 101 and may include any system, device, or apparatus configured to control functionality of the host device 100, including any or all of the memory 120, the force sensors 130, and the I/O unit 140. Controller 110 may be implemented as digital or analogue circuitry, in hardware or in software running on a processor, or in any combination of these.

Thus controller 110 may include any system, device, or apparatus configured to interpret and/or execute program instructions or code and/or process data, and may include, without limitation a processor, microprocessor, microcontroller, digital signal processor (DSP), application specific integrated circuit (ASIC), FPGA (Field Programmable Gate Array) or any other digital or analogue circuitry configured to interpret and/or execute program instructions and/or process data. Thus the code may comprise program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog TM or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware. Processor control code for execution by the controller 110, may be provided on a non-volatile carrier medium such as a disk, CD- or DVD-ROM, programmed memory such as read only memory (Firmware), or on a data carrier such as an optical or electrical signal carrier. The controller 110 may be referred to as control circuitry and may be provided as, or as part of, an integrated circuit such as an IC chip.

Memory 120 may be housed within enclosure 101, may be communicatively coupled to controller 110, and may include any system, device, or apparatus configured to retain program instructions and/or data for a period of time (e.g., computer-readable media). In some embodiments, controller 110 interprets and/or executes program instructions and/or processes data stored in memory 120 and/or other computer-readable media accessible to controller 110.

The force sensors 130 are housed within the enclosure 101, and are communicatively coupled to the controller 110. Each force sensor 130 may include any suitable system, device, or apparatus for sensing a force, a pressure, or a touch (e.g., an interaction with a human finger) and for generating an electrical or electronic signal in response to such force, pressure, or touch. Example force sensors 130 include or comprise capacitive displacement sensors, inductive force sensors, strain gauges, piezoelectric force sensors, force sensing resistors (resistive force sensors), piezoresistive force sensors, thin film force sensors and quantum tunnelling composite-based force sensors. There may be a mixture of types of force sensor amongst force sensors 130, where N>1.

In some arrangements, the electrical or electronic signal generated by a force sensor 130 may be a function of a magnitude of the force, pressure, or touch applied to the force sensor (a user force input) via the enclosure 101. Such electronic or electrical signal may comprise a general purpose input/output signal (GPIO) associated with an input signal in response to which the controller 100 controls some functionality of the host device 100. The term "force" as used herein may refer not only to force, but to physical quantities indicative of force or analogous to force such as, but not limited to, pressure and touch.

The I/O unit 140 may be housed within enclosure 101, may be distributed across the host device 100 (i.e. it may represent a plurality of units) and may be communicatively coupled to the controller 110. Although not specifically shown in FIG. 1, the I/O unit 140 may comprise any or all of a microphone, an LRA (or other device capable of outputting a force, such as a vibration), a radio (or other electromagnetic) transmitter/receiver, a speaker, a display screen (optionally a touchscreen), an indicator (such as an LED), a sensor (e.g. accelerometer, temperature sensor, gyroscope, camera, tilt sensor, electronic compass, etc.) and one or more buttons or keys.

As a convenient example to keep in mind, the host device 100 may be a haptic-enabled device. As is well known, haptic technology recreates the sense of touch by applying forces, vibrations, or motions to a user. The host device 100 for example may be considered a haptic-enabled device (a device enabled with haptic technology) where its force sensors 130 (input transducers) measure forces exerted by the user on a user interface (such as a button or touchscreen on a mobile telephone or tablet computer), and an LRA (linear resonant actuator) or other output transducer of the I/O unit 140 applies forces directly or indirectly (e.g. via a touchscreen) to the user, e.g. to give haptic feedback. Some aspects of the present disclosure, for example the controller 110 and/or the force sensors 130, may be arranged as part of a haptic circuit, for instance a haptic circuit which may be provided in the host device 100. A circuit or circuitry embodying aspects of the present disclosure (such as the controller 110) may be implemented (at least in part) as an integrated circuit (IC), for example on an IC chip. One or more input or output transducers (such as the force sensors 130 or an LRA) may be connected to the integrated circuit in use.

Of course, this application to haptic technology is just one example application of the host device 100 comprising the plurality of force sensors 130. The force sensors 130 may simply serve as generic input transducers to provide input signals to control other aspects of the host device 100, such as a GUI (graphical user interface) displayed on a touchscreen of the I/O unit 140 or an operational state of the host device 100 (such as waking components from a low-power "sleep" state).

The host device 100 is shown comprising N force sensors 130, labelled S1 to SN, with their signals labelled s1 to sN, respectively. Although four sensors are shown explicitly, it will be understood that this is just a convenient example. The host device 100 generally need only comprise a single force sensor 130 (i.e. N=1) in connection with the techniques described herein, although N=2, N=3, N=4 or N=7 may be considered advantageous in some arrangements. It may be said that N≥2 is a preferable configuration and that still preferably N≥4. Generally, the larger the value of N the greater the possibility of distinguishing a button press for one virtual button from that for another, and the greater the number M of virtual buttons that may be adequately defined. However, the larger the value of N the greater the number of sensor signals and thus the greater the complexity in handling them all.

Although FIG. 1 is a schematic, it will be understood that the sensors S1 to SN are located so that they can receive force inputs from a user, in particular a user hand or finger, during use of the host device 100. A particular user force input of interest in this context corresponds to a user touching, pushing, or pressing a virtual button, or swiping the device corresponding to time-staggered virtual button presses. A change in the amount of force applied may be detected, rather than an absolute amount of force detected, for example.

Thus, the force sensors S1 to SN may be located on the host device 100 according to anthropometric measurements of a human hand (e.g. so that a single human hand will likely apply a force to multiple force sensors). For example, the force sensors S1 to SN may be provided on the same side of the host device 100. Merely as an example, it will be understood that the force sensors S1 to SN are provided in a linear array 150 as indicated in FIG. 1. However, the array 150 need not be linear (in the sense of a straight line), and may define a curved line for example. As another example, the force sensors S1 to SN may be provided in a 2D (two-dimensional) arrangement, for example a 2D array (e.g. 2 rows, 3 columns, where N=6), for example to implement virtual buttons in different regions of a trackpad or similar input surface of a host device 100, for example when implemented as a trackpad-equipped laptop computer or standalone trackpad. The linear array 150 will be carried forward as a running example, however it will be recalled that other 1D (one-dimensional) and 2D arrangements are also envisaged.

The force sensors 130 are provided at different locations on the device, but may be in close proximity to one another. Of course, multiple groups of force sensors 130 (e.g. each corresponding to array 150) may be provided, e.g. on different sides of the host device 100, and each such group may be handled separately.

As a concrete example, FIG. 2 is a schematic diagram of a portion of the enclosure 101 of the host device 100, which serves as a sidewall of the host device 100 and alongside which the example linear array 150 of force sensors 130, S1 to S4, is mounted. In this example, the force sensors 130 are implemented as inductive force sensors and thus comprise respective coils ($coil_1$ to $coil_4$) disposed on a circuit board 102 which is spaced apart from the sidewall 101 by spacers 104.

Here, the sidewall 101 has been shaped adjacent the linear array 150 of force sensors 130, S1 to S4, to form a physical button shape having a button size (e.g. 10 to 60 mm). Also, the sidewall 101 is assumed to comprise a metal plate. When subjected to a force, the metal sidewall 101 of the device 100 is deflected. The changing distance d from the coils affects (i.e. changes) respective circuit inductances which can be measured as representative of an applied force. That is, a change in the distance d between a metal "plate" from the sidewall 101 and a coil is detected as a change of inductance. As indicated in the graph of FIG. 2, the displacement of the button may vary with position relative to the position of the applied force. For example, in FIG. 2 it is assumed that a (constant) force is applied at position 0 mm and that the physical displacement of the button (i.e. of the metal plate, or sidewall 101), relative to when the force is not applied, is measured at the range of positions shown. Sensors 130 may be considered strongly mechanically coupled/correlated by virtue of the shared sidewall 101, as apparent in FIG. 2.

As apparent from FIG. 2, the metal plate or sidewall 101 corresponds to a surface of the device, and the portion of that surface forming a physical button shape having a button size may be considered an input region 105 of the surface. In the present running example the force sensors S1 to SN are provided in the linear array 150 and the input region 105 may also be thought of as linear (although in practice it will of course be at least two-dimensional). Where the sensors 130 are arranged in e.g. a 2D array, for example in a trackpad implementation, the input region may be more clearly two-dimensional, for example being a square or rectangle or circle. For example, where the input region is square or rectangular, a sensor 130 may be located in each corner of the input region, for N=4. Any such input region need not be flat, and could be curved.

As mentioned earlier, the notion of "types" of device (e.g. models, form factors) is considered herein. A given type in this context may taken to define devices of that type as comprising (for example, looking at FIG. 2) a defined arrangement of the surface 101 and the N force sensors of the device concerned, where N≥1, each force sensor configured to output a sensor signal. Thus, the type effectively defines the performance of the array 150 of force sensors 130 in the running example, taking into account the force sensors 130 themselves (e.g. the value of N, the type of force sensors) and the mechanical interaction or coupling with the shared sidewall/surface 101 (e.g. the material, shape, structure of the surface 101 and how the force sensors 130 cooperate with—in some cases, even form part of—that surface 101). In the defined arrangement (for that type), the N force sensors are operatively coupled to a defined input region 105 of the surface 101 so as to sense a force applied to that input region 105.

The device 100 will be considered hereinafter to be of a given (i.e. defined) type, and thus to have a defined arrangement of the surface 101 and the N force sensors. Devices of the same type may have the same mechanical/electrical/electronic design (at least as impacts their force sense input functionality). Devices of the same type may be of the same model, and be manufactured in large numbers e.g. on a production line. The device type may be taken to govern the structure and arrangement/configuration of devices of that type which affects the performance of their force sense input functionality (e.g. array 150 in the running example). The given type will be referred to as type X hereinafter for convenience, however it will be appreciated that the teaching herein may be applied to another device type, e.g. a type Y.

Also shown schematically in FIG. 2 are a plurality of locations 106 at which a response of the device 100 of type X to an applied force may be measured, as will be considered in more detail later.

Figure 3:
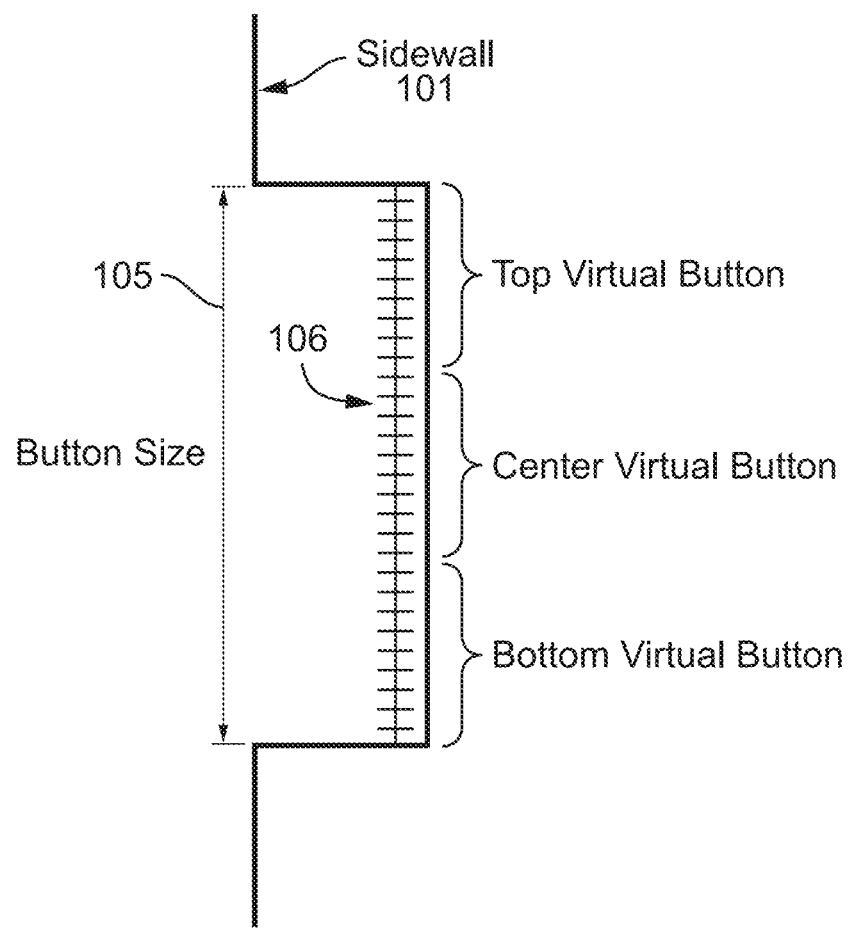
FIG. 3 is a schematic diagram corresponding to that of FIG. 2, useful for understanding virtual buttons.

FIG. 3 is a schematic diagram of the same portion of the sidewall (enclosure) 101 of the host device 100 as in FIG. 2, omitting the force sensors 130, S1 to S4, for simplicity, and orientated vertically to better correspond to the linear array 150 of FIG. 1. As indicated, top, center and bottom regions of the physical button are defined as corresponding to top, center and bottom virtual buttons, respectively. Thus, for example, the application of a force in the top region of the physical button may be detected and determined to correspond to the push or press of the top virtual button. In some cases, the number N of sensors 130 may be less than the number M of virtual buttons (or positions) due to physical space limitations, number of channels available, etc. Recall that 2D (e.g. trackpad) implementations are envisaged.

In general, an objective may be taken as to map the signal from one or more sensors 130 to a "discrete" button press state. For example, even when N=2, it may be possible to distinguish between top, center and bottom virtual button presses (i.e. M=3) in line with FIG. 3. Button press states may comprise pressing on a single physical region (e.g. center) of a button (corresponding to a single virtual button press), pressing simultaneously on multiple physical regions of the button (e.g. corresponding to multiple virtual button presses—e.g. center and bottom at the same time). Gestures on the physical button may also be detected (e.g. swiping upwards). An anomaly affecting the sensor/s associated with the button (e.g. twisting the host device 100) may also be detected (e.g. after appropriate firmware processing).

Figure 4:
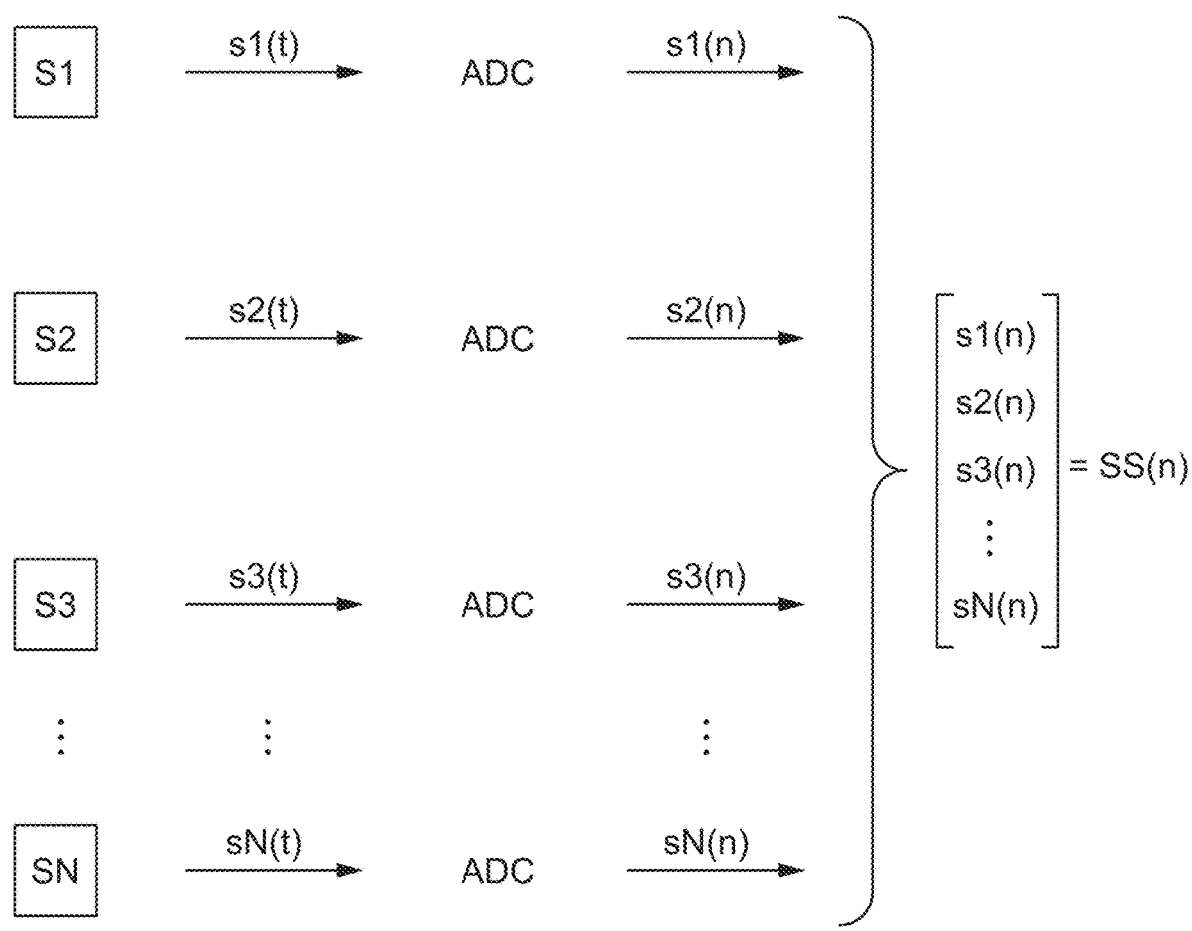
FIG. 4 is a schematic diagram indicating how signals from force sensors of the host device may be arranged and handled.

FIG. 4 is a schematic diagram indicating how the signals from the force sensors S1 to SN may be arranged and handled.

Depending on how the force sensors 130 are configured, the force sensors S1 to SN may provide analogue signals $s1(t)$ to $sN(t)$, respectively, where t is time e.g. in seconds. These analogue signals may then be converted by analogue-to-digital conversion, ADC, to corresponding digital sample streams $s1(n)$ to $sN(n)$, where n is the sample number. Of course, the force sensors S1 to SN may output respective digital sample streams $s1(n)$ to $sN(n)$ directly.

At this juncture, it is noted that force sensors 130 as deployed in modern host devices produce signals that have a slowly varying baseline level that is modulated by physical events (e.g. changes in ambient temperature or pressure). A baseline level may be taken to mean a level (e.g. bias level) at which a corresponding raw sensor signal is taken to indicate a zero magnitude or zero input. In the case of a force sensor, a baseline level may be taken to mean a level at which a corresponding raw sensor signal is taken to indicate zero applied force. A baseline signal may be taken to mean a signal which indicates baseline level. Ultimately, force information may be determined from a given raw sensor signal based on a difference between that raw sensor signal and its corresponding baseline signal.

Typically, the signals subject to analogue-to-digital conversion, ADC, are the raw sensor signals, i.e. before the baseline signals are subtracted therefrom. However, baseline subtraction could equally be applied prior to analogue-to-digital conversion. For simplicity, the baseline subtraction is not shown in FIG. 4.

It will be assumed, again for simplicity, that the sensor signals considered hereinafter (whether they are pre or post analogue-to-digital conversion) are sensor signals whose values are relative to their baseline levels, i.e. which indicate a difference between a raw sensor signal and its corresponding baseline signal.

Assuming the sample streams are synchronised for convenience, the force sensors S1 to SN may be considered to provide a stream of sensor samples SS(n), as indicated in FIG. 4, which each include a sample value from each of the N sensors. Each such sensor sample SS(n) may thus be represented in vector (or matrix) form as:

$$SS(n) = \begin{bmatrix} s1(n) \\ s2(n) \\ s3(n) \\ \vdots \\ sN(n) \end{bmatrix}$$

Figure 5:
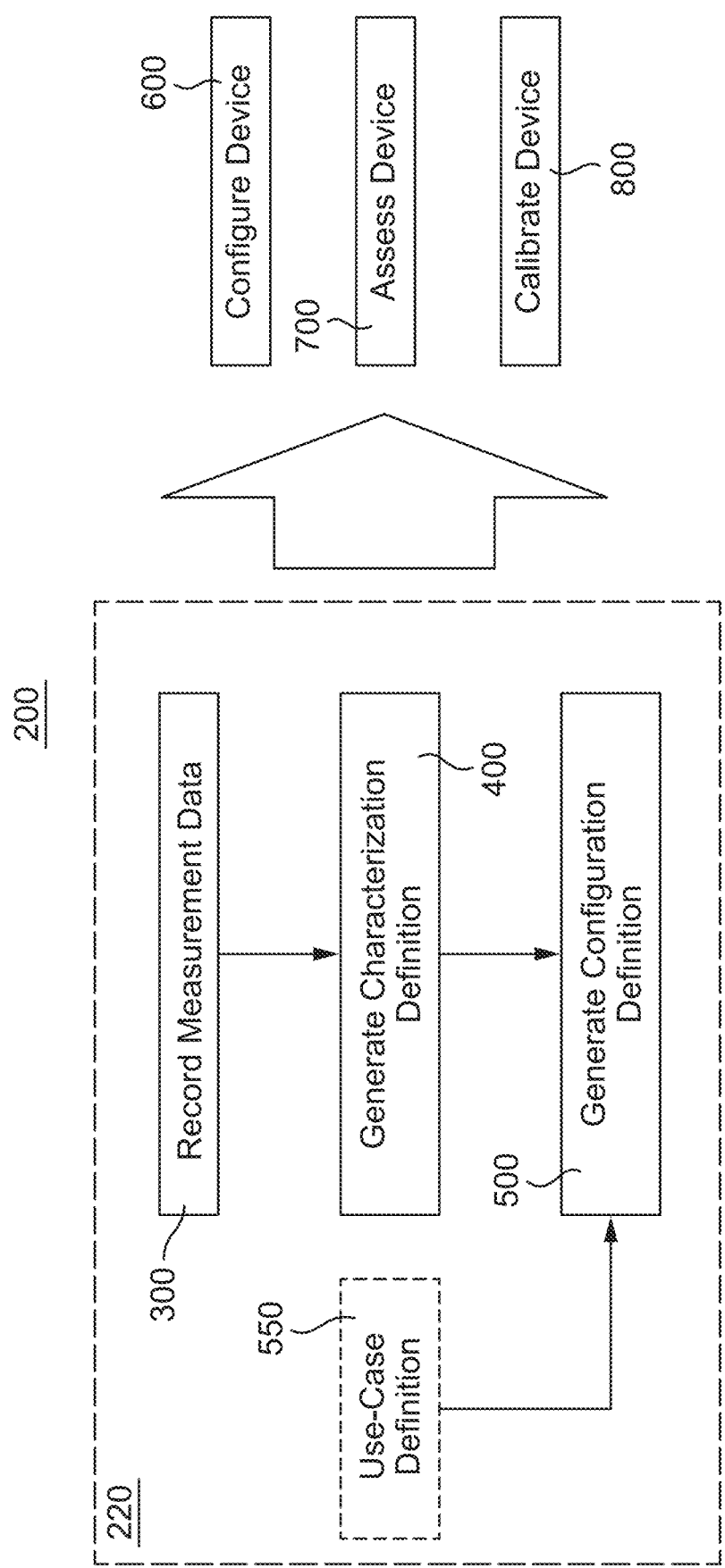
FIG. 5 is a schematic diagram representing a group of techniques which may be implemented as methods.

FIG. 5 is a schematic diagram representing a group 200 of techniques considered herein, useful to configuring the device 100 (and other devices of type X) for useful operation, e.g. to implement M virtual buttons according to a use-case definition. As will become apparent, the techniques may be implemented as methods, and in some cases as apparatuses, computer programs and computer-readable storage media.

As above, for convenience, it will be assumed hereinafter that the devices considered are of type X, being "the given type". Looking at FIG. 2 for ease of understanding, the type X defines devices of that type (such as device 100) as comprising a defined arrangement of its surface 101 and N force sensors 130, where N≥1, each force sensor 130 configured to output a sensor signal, wherein in the defined arrangement the N force sensors 130 are operatively coupled to a defined input region 105 of the surface 101 so as to sense a force applied to that input region 105. The linear array 150 continues as the running example, but recall that 2D arrangements are also envisaged.

Focusing on the techniques being implemented as methods for convenience, the group 200 comprises a method 300 of recording measurement data for characterizing a response of a type X device to an applied force, a method 400 of generating a characterization definition which defines a response of a type X device to an applied force, a method 500 of generating a configuration definition for configuring a type X device for a given use case defined by a use-case definition 550, a method 600 of configuring a candidate device of type X for the given use case, a method 700 of assessing a candidate device of type X, and a method 800 of calibrating a candidate device of type X.

As indicated in FIG. 5, the methods 300, 400 and 500 may collectively be considered a group of methods 220 which lead to the recording of measurement data, the generation of a characterization definition and the generation of a configuration definition. As also indicated, the recorded measurement data may be used in method 400, and the generated characterization definition may be used in method 500. However, it is envisaged that the method 400 may use synthetic data (e.g. generated by simulation) equivalent to the recorded measurement data. The method 500 may use a characterization definition which is synthetic or otherwise did not originate from actual recorded data. Any or all of the measurement data, characterization definition and configuration definition may be employed in methods 600, 700 and 800.

Additionally, although all of methods of group 200 are shown in FIG. 5, one or more, or a combination of two or more, of the methods may be provided separately from the other methods.

Turning first to method 300, i.e. of recording measurement data for characterizing a response of a type X device to an applied force, the method 300 comprises, for a specimen device of type X, performing at least one measurement procedure, each measurement procedure comprising at least one measurement operation, each measurement operation comprising applying a defined force at a corresponding location on the input region of the device concerned and recording measurement data for that device and location based on the sensor signals of the N force sensors of that device.

Figure 6A:
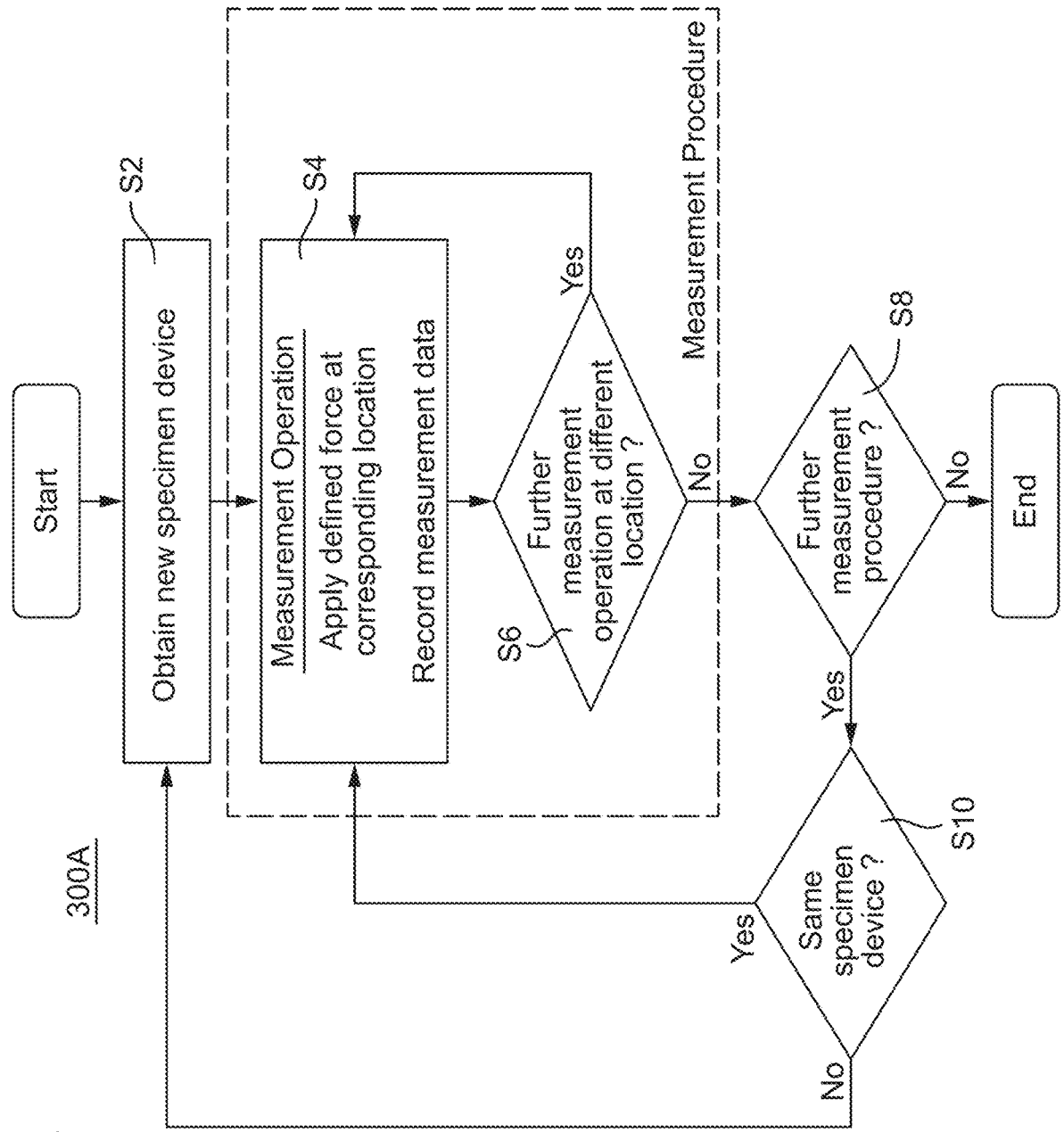
FIG. 6A is a flowchart of a method being an implementation of a technique of FIG. 5.

FIG. 6A is a flowchart of a method 300A being an implementation of method 300, and FIG. 6B is a schematic diagram of example measurement apparatus 320 which may be used to implement method 300A.

The measurement apparatus 320 comprises a clamp 322, a controllable plunger arrangement 324 and a controller 326. The controllable plunger arrangement 324 comprises a guideway 328, an actuator 330 and a plunger 332.

As indicated, during use a specimen device 100A, being an example of device 100 (i.e. of type X), is clamped into a test position using the clamp 322. Further, the controller 326 is communicatively coupled to the actuator 330 and the specimen device 100A so as to control the actuator 330 and receive sensor signals from its N force sensors 130 (not shown). Also shown schematically (as in FIG. 2) are a plurality of locations 106 at which a response of the device 100 to an applied force may be measured. These locations serve as discrete locations along the input region 105 of the surface 101 (e.g. casing or enclosure) of the device 100A.

Under control by the controller 326, the actuator 300 aligns the plunger 332 with one of the discrete locations along the input region 105 and applies a known (given or defined) force (i.e. a press) to that location on the input region 105 (by lowering the plunger 332 against the input region 105) whilst the N force sensors 130 (not shown) generate respective sensor signals which are received by the controller 326. The controller 326 may be implemented as computing apparatus, and as such the measurement apparatus 320 may be referred to as a computer-controlled machine or a robot.

The apparatus 320 may be employed to take measurements at any number of, or all of, the discrete locations 106 along the input region 105. Of course, the number of discrete locations 106, and their relative separation is shown schematically in FIGS. 2, 3 and 6B, and is just an example. It may be for example that the input region 105 is discretized into 50 to 150 or even more discrete locations, at each of which measurements may be taken.

With this in mind, focus is returned to FIG. 6B and method 300A. The method starts by passing to step S2, in which a new specimen device 100A of type X is obtained. This may be interpreted as determining that a specimen device 100A is clamped in the clamp 322 and that the measurement apparatus 320 is ready for use.

The method then proceeds to step S4, which is the first step in a measurement procedure. In step S4, a measurement operation is carried out, in which a known (given or defined) force (i.e. a press) is applied at a corresponding one of the locations 106 on the input region 105 (for example, for a known or defined period of time) whilst the N force sensors 130 (not shown) generate respective sensor signals which are received by the controller 326. The plunger 332 is shown as aligned with the left-most discrete location in FIG. 6B, by way of example. Measurement data for that measurement operation is recorded based on the received sensor signals for that measurement operation.

The method then proceeds to step S6 in which it is determined whether a further measurement operation should be carried out at a different location 106 on the input region 105. If it should (S6, YES), the method returns to step S4 and a measurement operation is carried out at the corresponding next location 106 on the input region 105. In this way, the measurement procedure, comprising steps S2 and S4, may comprise any number of measurement operations, and these may correspond to a progression through the discrete locations 106, e.g. from left to right in FIG. 6B. If it is determined in step S6 that no further measurement operation should be carried out in that measurement procedure (S6, NO), the method proceeds to step S8.

In step S8, it is determined whether a further measurement procedure should be carried out and, if so (S8, YES), whether it should be carried out on the same specimen device 100A at step S10.

If a further measurement procedure should be carried out on the same specimen device 100A (S8, YES; S10, YES), the method returns to step S4. In this way, multiple measurement procedures may be performed on the same specimen device 100. For example, the recorded measurement data may be processed to generate average measurement data by averaging the measurement data on a per measurement operation basis (i.e. per discrete location 106 basis) over the plurality of measurement procedures.

If a further measurement procedure should be carried out but on a different specimen device 100A (S8, YES; S10, No), the method returns to step S2. In this way, multiple measurement procedures may be performed on different specimen devices 100A, each of type X. Again, the recorded measurement data may be processed to generate average measurement data by averaging the measurement data on a per measurement operation basis (i.e. per discrete location 106 basis) over the plurality of measurement procedures.

If no further measurement procedure should be carried out (S8, NO), the method terminates.

For each measurement operation, the recorded measurement data may comprise an array or series of samples representing the changing magnitudes of each of the sensor signals, for example showing a rise and then fall of those magnitudes (depending on the force sensor location) representing the press concerned. It may however be that the recorded measurement data, for each measurement operation, comprises at least one (or only one) value for each of the N force sensors based on the sensor signals concerned. Each such value may be a maximum or average amplitude (or other representative value) of the sensor signal concerned.

As above, generally N≥1 however it may be advantageous when N≥2. It may be that N≥4 or even N≥8. It will be assumed for the sake of example that type X specifies that N=7 hereinafter, i.e. that there are 7 force sensors 130, S1 to S7. Each measurement procedure may be taken to comprise P measurement operations, where P≥2, the respective locations for the P measurement operations on the input region of the device concerned being different from one another.

As above, P may be a large number and there may for example be many corresponding discrete locations 106 along the input region 105. For example, where P corresponds to the number of such discrete locations (i.e. there is one measurement operation per discrete location in each measurement procedure), it may be that P is P≥X.N and that X is X≥1, or X≥2 or X≥4 or even X≥10 or more. For example, P may be any number between 1 and 1000. The different discrete locations may in practice be close together, for example around 0.5 mm (e.g. between 0.1 and 1 mm) apart. As indicated, the discrete locations may be regularly or evenly distributed, across the input region 105. Recall that 2D (e.g. trackpad) implementations are envisaged.

To allow consistency of measuring and comparison of results between devices of type X, the discrete locations may be defined relative to an external profile of the candidate device 100A, or relative to a reference location on the candidate device 100A defined for type X, or relative to the input region 105 of the candidate device 100A.

Of course, where the sensors 130 are distributed across different sides of the device 100A, the measurement apparatus 320 may be adapted (e.g. by adapting the clamp 322 to receive the candidate device 100A in different orientations) to take measurement data on those different sides. For example, there may be multiple input regions 105.

FIG. 6C is a graph of example recorded measurement data for a measurement procedure performed according to method 300A on the specimen device 100A. Each press (i.e. each measurement operation S4) is identified by its high amplitude (i.e. maximum) recorded for each of the 7 force sensors 130, S1 to S7, based on their respective sensor signals. For each press (i.e. each measurement operation S4), the seven high amplitudes are plotted in the same location on the x-axis of the graph, so that position on the x-axis corresponds to position on the input region 105. Thus, the individual peaks identified as presses in FIG. 6C align with the discrete locations 106, and there are 7 peaks at each location corresponding to the 7 force sensors 130, S1 to S7, respectively. As such, it is assumed here that the consecutive presses are applied to one discrete location after the next consecutively across the input region from one side to the other (e.g. left to right). The y-axis indicates Voltage (in microvolts) and thus is representative of the magnitude of force detected.

Where the sensors 130 are in a 2D arrangement such as in a 2D array, the x-axis and y-axis may both correspond to position on the input region (in different dimensions), with the graph having a z-axis for Voltage (in microvolts) representative of the magnitude of force detected.

Turning next to method 400, i.e. of generating a characterization definition which defines a response of a type X device to an applied force, the method 400 comprises obtaining recorded measurement data for devices of type X, and generating the characterization definition based on the recorded measurement data. The recorded measurement data may be, or have been, recorded by the method 300 or 300A. For example, the recorded measurement data (or equivalent synthetic data, e.g. generated by simulation) may be accessed from storage.

As one example, generating the characterization definition may comprise generating a characterization function, which may comprise a function (e.g. transfer function) per force sensor of the N force sensors, and even per location of press, or may be considered an overall characterization function which describes the transfer function for all of the sensors 130 and discrete locations 106. For a given force sensor, e.g. sensor S1, characterization functions for the different locations may be presented as a combined characterization function defining a relationship between discrete input region location 106 and sensitivity of the force sensor concerned.

It can be seen that the graph of FIG. 6C enables such characterization functions to be generated for the discrete locations shown. For example, if the magnitude of the applied force of each press is known (e.g. it may be a 1 N press), the magnitudes (which may be in units of force such as Newtons, or in units such as Volts which are nevertheless representative of force) shown may be divided by the force magnitude to represent sensor sensitivities. The sensitivities may also be normalized (e.g. to have values ranging between +1 and −1, to enable both positive and negative detected forces to be represented).

FIG. 7 is a graph showing an example conversion of the measurement data from FIG. 6C to present a continuous characterization function per force sensor 130. The x-axis represents the distance of the discrete position from that of the first press and the y-axis represents normalized sensitivity (with values ranging between +1 and −1, as mentioned above). In this example, it is assumed that the input region 105 (touching area) is linear as it is associated with the linear array 150, and has a length of 44 mm. Recall however that 2D (e.g. trackpad) implementations are also envisaged (e.g. there may be x, y and z axes). Also, the discrete transfer functions per discrete location 106 and force sensor 130 obtained from each press have been merged into a continuous characterization function per force sensor 130.

As another example, generating the characterization definition may comprise generating cross-talk information by determining from the recorded measurement data, for at least one of the N force sensors 130, a magnitude of the sensor signal for each other force sensor 130 of the N force sensors at an input region location 106 where the sensor signal for the force sensor 130 concerned has its maximum value.

FIG. 8 is a matrix of example cross-talk parameters, which may be automatically calculated from the recorded measurement data of FIG. 6C, or similarly from FIG. 7.

The cross-talk parameters are normalized, i.e. take values between −1 and +1 as earlier, and indicate the cross-talk between the sensors (i.e. how much force leaks to a sensor (x-axis) when pressing on another sensor (y-axis)). It can be seen that the parameter values shown in FIG. 8 can be readily read off the graph of FIG. 7, and thus that the matrix of cross-talk parameters may be automatically generated from the recorded measurement data. For example, when the sensor S1 is pressed with a force of (normalized) value 1, i.e. by pressing in a location on of the input region 105 directly above the sensor S1, that sensor S1 detects the force of value 1, and the other sensors S2 to S7 detect forces of value 0.52, 0.26, 0.16, 0.076, −0.015 and −0.31, respectively.

Put another way, the cross-talk matrix is created by taking the N amplitude values for each of the sensors' peak locations. Therefore, the cross-talk matrix is an (N×N) matrix, with the value at the ith row and the jth column giving the percentage of the ith force sensor force seen on the jth force sensor when pressing on the location of the ith force sensor. This information is useful to understand the level of cross-talk between the force sensors 130.

Such parameters may be used to help ensure that events are only triggered when a force is applied on the input region 105 (touching area) in accordance with a given use case, for example to help ensure that virtual buttons defined in the use case respond as expected (i.e. as mechanical buttons). This information may indeed form part of a configuration definition for devices of type X. Such a use case, defining virtual button areas as parts or portions of the input region 105, may be specified for a given application of the device 100, and those parts or portions may be automatically translated to the positions in the characterization function.

It will be appreciated that the method 400 may be carried out on computing apparatus, for example on the controller 326. Method 400 may thus be implemented by calculation, such as by using an algorithm. Thus, implementations may comprise computing apparatus configured to carry out method 400, and corresponding computer programs and computer-readable storage media.

Turning next to method 500, i.e. generating a configuration definition for configuring a device of type X for a given use case defined by a use-case definition, the method 500 comprises obtaining a characterization definition for devices of type X, and generating the configuration definition for the given use case based on the characterization definition and the use-case definition.

In terms of purpose, the configuration definition (e.g. tuning configuration) may be applied to a device of type X (device 100 or 100A) to configure it to operate according to the use-case definition, for example by storing the configuration definition in the device or configuring parameters (e.g. tuning values) stored in the device according to the configuration definition.

As above, such a use case may for example define virtual button areas as parts or portions of the input region 105, and may be specified for a given application. Also, the characterization definition may be, or have been, generated by the method 400. For example, the characterization definition may be accessed from storage.

For example, consider a use-case definition which defines M virtual buttons, where M≥1, with each virtual button corresponding to a respective portion of the input region 105. The use-case definition may for example simply define the portions of the input region 105 which correspond to the M virtual buttons, respectively. The configuration definition may define a mapping between the N force sensors and the M virtual buttons, i.e. between the sensor signals of the N force sensors and equivalent button signals of the M virtual buttons.

Put another way, the characterization definition may define a first relationship between input region location and sensitivities of the N force sensors, and the use-case definition may define a second relationship (or aspects/parameters thereof) between input region location and desired sensitivities of the M virtual buttons. The mapping may thus effectively map the first relationship to the second relationship or to a second relationship which satisfies the use-case definition, e.g. to an acceptable degree which may also be defined in the use-case definition.

As an example implementation, the mapping may be implemented as a sensor to button weight matrix S2B which is used to calculate button signals (equivalent to sensor signals but for the virtual buttons) from the sensor signals as a weighted average. Such an example implementation is shown in FIG. 9, where z(n) represents a (1×M) matrix of digital samples for the M button signals, y(n) represents a (1×N) matrix of digital samples for the N sensor signals, and S2B is an (N×M) matrix of weights which effect the weighted averaging.

The individual weights s2b of the S2B matrix are denoted in a format which represents in respect of which signals each weight applies. For example, the weight $s2b_{11}$ is applied between the signals for sensor 1 (S1) and virtual button 1 (VB1), the weight $s2b_{12}$ is applied between the signals for sensor 1 (S1) and virtual button 2 (VB2), and the weight $s2b_{NM}$ is applied between the signals for sensor N (SN) and virtual button M (VBM). The weights of the S2B matrix may for example have values between −1 and +1.

Thus, the mapping may be set (e.g. by setting the values of the weights of the S2B matrix) to give effect to the use case concerned. The use-case definition may for example simply define boundaries of portions of the input region 105 corresponding to the M virtual buttons, as mentioned earlier. The portions of the input region 105 corresponding to the M virtual buttons may be non-overlapping portions of the input region, and may be adjoining portions of the input region 105.

Figure 10:
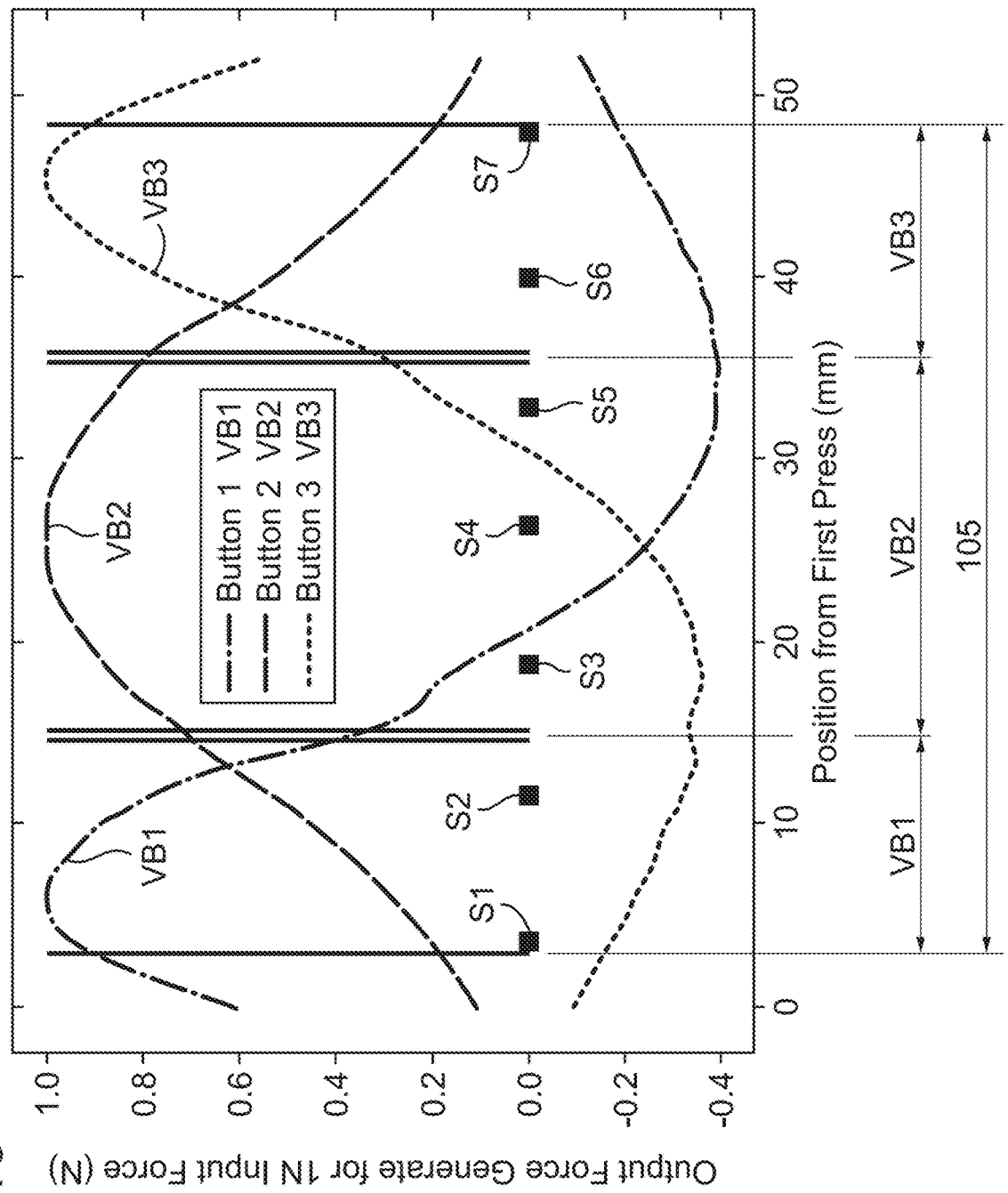
FIG. 10 is a graph useful for understanding how a given use-case definition may be used to generate a configuration definition.

FIG. 10 is a graph useful for understanding how a given use-case definition may be used to generate the configuration definition (e.g. the S2B matrix) based on the characterization definition (e.g. the graph of FIG. 7, or corresponding characterization functions).

In the graph of FIG. 10, for consistency with FIG. 7, the x-axis represents the distance of the discrete position from that of the first press and the y-axis represents normalized sensitivity (with values ranging between +1 and −1 as mentioned above), expressed as output force in Newtons generated for a 1 N input force. Again for consistency with FIG. 7, the input region 105 (touching area) is linear, and has a length of 44 mm.

Superimposed onto the graph of FIG. 10 are single vertical solid lines indicating the external boundaries of the input region 105 and double vertical lines indicating the boundaries between virtual buttons. These boundaries may be expressed in the use-case definition, and here it is assumed that three virtual buttons, VB1, VB2 and VB3, are defined. The extent of the input region 105, and of the portions of the input region 105 corresponding to the three virtual buttons, VB1, VB2 and VB3, are indicated underneath the graph. Also superimposed onto the graph of FIG. 10 are square markers indicating the approximate positions of the sensors S1 to S7, as also indicated. There may thus be information defining the locations of the sensors 130 relative to the input region 105 and/or to portions of the input region 105 corresponding to the respective virtual buttons, based on which the S2B matrix (i.e. the mapping) may be generated.

Also shown on FIG. 10 are example sensitivity vs. location traces for the three virtual buttons, VB1, VB2 and VB3, corresponding to those for the sensors S1 to S7 shown in FIG. 7. The method 500 thus, in this example, may be understood as effectively setting the weights of the S2B matrix to generate the traces of FIG. 10 (or other traces which satisfy the use-case definition e.g. to an acceptable degree) given the traces of FIG. 7 and the use-case definition which defines the desired boundaries of the three virtual buttons, VB1, VB2 and VB3.

Of course, although the graphs are useful for understanding the present invention, the characterization definition need not be provided in the form of the graph of FIG. 7, and may be provided in the form of one or more characterization functions, models or parameters. Similarly, the configuration definition need not be generated in the form of the S2B matrix, and may similarly be provided in the form of one or more functions, models or parameters.

The characterization definition (characterization function) may accordingly be employed to create a force response per button in a desired space in the input region 105 (touching area), i.e. meeting the use-case definition concerned. For example, FIG. 10 shows the output of calculating the configuration definition (e.g. mapping, such as the S2B matrix) to generate a desired (e.g. optimized) response of each virtual button, or at least a response of each virtual button which meets the use-case definition to an acceptable level. As shown in FIG. 10, the configuration definition (e.g. mapping, such as the S2B matrix) has been calculated such that the force/sensitivity of a given virtual button (e.g. VB1) in its virtual button area (e.g. from 0 mm to 12 mm) is higher than for the other virtual buttons and is close to 1 in the normalized scale (i.e. the output force or force detected for that virtual button is substantially the same as the input force). Similar considerations apply to the other virtual buttons as apparent from FIG. 10. Thus, it may be that many different sets of traces effectively meet the use-case definition, in that they allow implementation of the virtual buttons VB1, VB2 and VB3. The particular set of traces in FIG. 10 is just an example, and indeed an iterative process may be used to explore different mappings (each giving different sets of traces) which satisfy the use-case definition to different degrees or in different ways.

More information may be extracted from characterization definition (characterization function) such as the cross-talk between virtual buttons (equivalent to the information of FIG. 8, but for the virtual buttons) or confidence threshold levels per button. For example, a ratio or log ratio of forces detected by particular force sensors 130 which would indicate that a force is applied in a given location (e.g. centre of a defined virtual button) can be compared against a ratio or log ratio of actual forces detected by those force sensors 130, to determine a confidence level which indicates how close the applied force is to the defined location. Such a confidence level could then be compared to a confidence threshold level to reject force sense events (detected applied forces above a force threshold level) which do not have a high enough confidence level (i.e. above the confidence threshold level) to indicate that the applied force is in the location of, or close enough to, the defined location. Such a ratio or log ratio of forces detected by particular force sensors 130 which would indicate that a force is applied in the given location may be determined from the characterization definition, for example by looking at the ratio (or log ratio) of values from the particular force sensors 130 at the given location in FIGS. 6C and/or 7. Such a confidence threshold level could also be determined from the characterization definition, for example by looking at the ratio (or log ratio) of values from the particular force sensors 130 at locations around the given location.

The characterization definition is accordingly useful for achieving a desired performance (e.g. as defined in the use-case definition) without needing to consider the detailed construction of the device 100. Time-to-solution may thus be reduced, and in addition solutions may be readily adapted by changing the use-case definition. For example, in the case of the example of FIG. 10, the centre of the virtual buttons may be moved visually as well as making them wider or narrower, and the configuration definition (e.g. mapping, such as the S2B matrix) recalculated accordingly. For example, in the example of FIG. 10 the middle virtual button VB2 is wider than the other virtual buttons VB1 and VB3, but this need not be so. Note that this recalculation may be carried out without need, assuming the same type X, to recollect the measurement data e.g. according to FIGS. 6A to 6C.

One advantage of generating the configuration definition (e.g. in the form of the S2B matrix) based on the characterization definition is that it may be calculated using an algorithm, rather than for example the weights of the S2B matrix being arrived at by manual guesswork or trial by error.

For example, such a mapping may be generated iteratively, e.g. based on evaluating one or more use-case cost functions (which may also be defined by the use-case definition), each use-case cost function defining an effect of the mapping on one or more performance metrics of the device concerned. The mapping may be generated in this way to reduce, minimize, increase or maximize at least one use-case cost function or a combination of at least two use-case cost functions defined by the use-case definition.

As a concrete example, the use-case definition may define that cross-talk between the M virtual buttons should be minimized or at least reduced (to a satisfactory or defined level). The method 500 may thus comprise generating the mapping to reduce or minimize cross-talk between the M virtual buttons by adjusting the mapping to reduce or minimise a cross-talk cost function (being a use-case cost function defined by the use-case definition) which defines an effect of the mapping on cross-talk between the M virtual buttons.

Figure 11A:
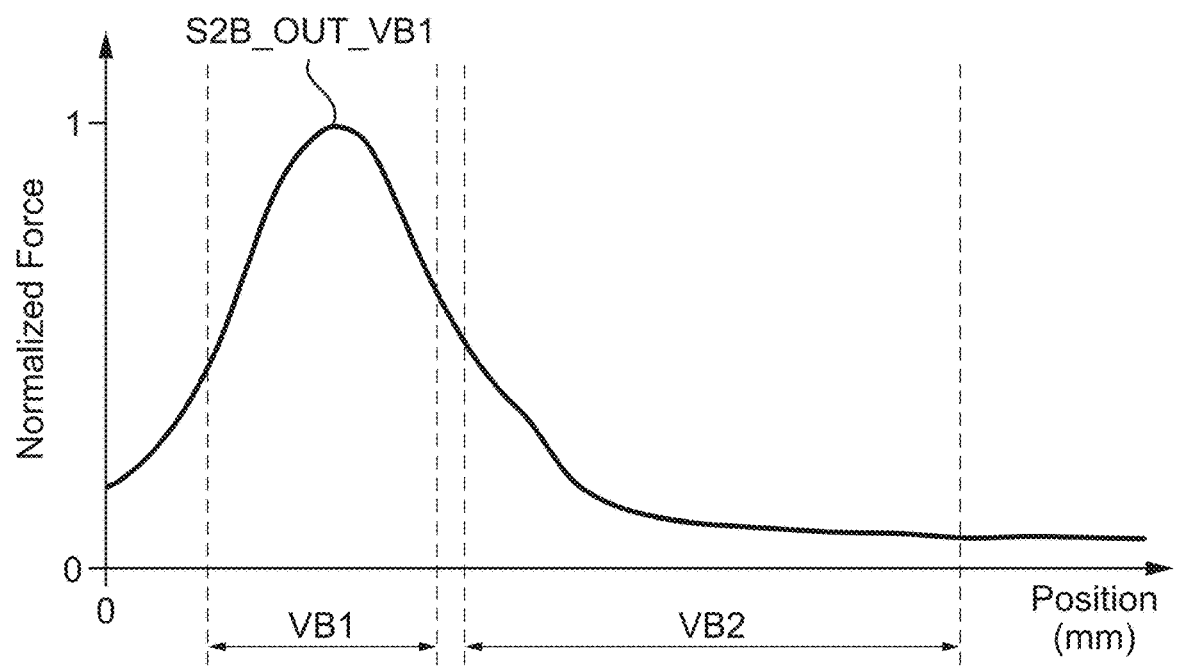

For example, reference is made to FIG. 11A, which is a graph showing an example normalised virtual button force for virtual button VB1 after sensor-to-button mapping, denoted S2B_OUT_VB1. The x-axis represents position on the input region 105 in millimetres and the y-axis represents normalised force.

The vertical dashed lines represent desired boundaries of example virtual buttons VB1 and VB2, as indicated below the graph. The position of these boundaries, and thus the areas of the virtual buttons VB1 and VB2, may be defined by the use-case definition (e.g. by the user).

The amount of cross-correlation from virtual button VB1 to VB2 may be denoted CC_VB1_VB2, and may be defined by the maximum level of S2B_OUT_VB1, or the area below S2B_OUT_VB1, within the limits of the area defined for virtual button VB2.

If the maximum level of (or area under) S2B_OUT_VB1 within the limits of the area defined for virtual button VB1 is denoted S2B_OUT_VB1(vb1_*lims*), and within the limits of the area defined for virtual button VB2 is denoted S2B_OUT_VB1(vb2_*lims*), a useful measure (which might be referred to as an "anti-correlation" measure) could be defined as:

$$AC\_VB1\_VB2 = \frac{S2B\_OUT\_VB1(vb1\_lims) - S2B\_OUT\_VB1(vb2\_lims)}{S2B\_OUT\_VB1(vb1\_lims) + S2B\_OUT\_VB1(vb2\_lims)}$$

This means that as the cross-correlation increases the numerator gets small and the denominator gets larger (and AC_VB1_VB2 gets small) and as the cross-correlation decreases AC_VB1_VB2 approaches 1.

The cross-correlation CC_VB1_VB2 (from virtual button VB1 to VB2) may then be defined as follows, where the smallest value (zero) corresponds to the lowest level of cross correlation:

$$CC\_VB1\_VB2 = 1 - [AC\_VB1\_VB2]$$

This definition of CC_VB1_VB2 may be used as a cost function. In this way, the S2B mapping may be adjusted (which would adjust the trace for S2B_OUT_VB1) to iteratively minimise the cost function CC_VB1_VB2. Thus, when CC_VB1_VB2=0, the trace for S2B_OUT_VB1 would be zero between the boundaries for virtual button VB2.

It will be appreciated that a cross-talk matrix equivalent to that in FIG. 8 could be determined e.g. based on one or more of FIGS. 6C, 7 and 10, to show cross-talk as regards virtual buttons. For example, rather than having the sensors 130 on the x-axis as in FIG. 8 the virtual buttons could be represented instead. Again, the cross-talk parameters may be normalized, i.e. take values between −1 and +1 as earlier, and indicate the cross-talk between the sensors/buttons (i.e. how much force leaks to a virtual button (x-axis) when pressing on a sensor (y-axis)). Another example could show virtual-button to virtual-button cross-talk, by having virtual buttons on both the x and y axes. Again, the cross-talk parameters may be normalized, i.e. take values between −1 and +1 as earlier, and indicate the cross-talk between the buttons (i.e. how much force leaks to a virtual button (x-axis) when pressing on a virtual button (y-axis)). Such parameters may be assessed/tuned in relation to a use-case definition.

As another concrete example, the use-case definition may define that simultaneous pressing of two of the M virtual buttons should be detectable. The method 500 may thus comprise generating the mapping to assist detection of simultaneous pressing of two of the M virtual buttons by adjusting the mapping to reduce or minimise a simultaneous-press cost function (being a use-case cost function defined by the use-case definition) which defines an effect of the mapping on simultaneous-press detection.

Figure 11B:
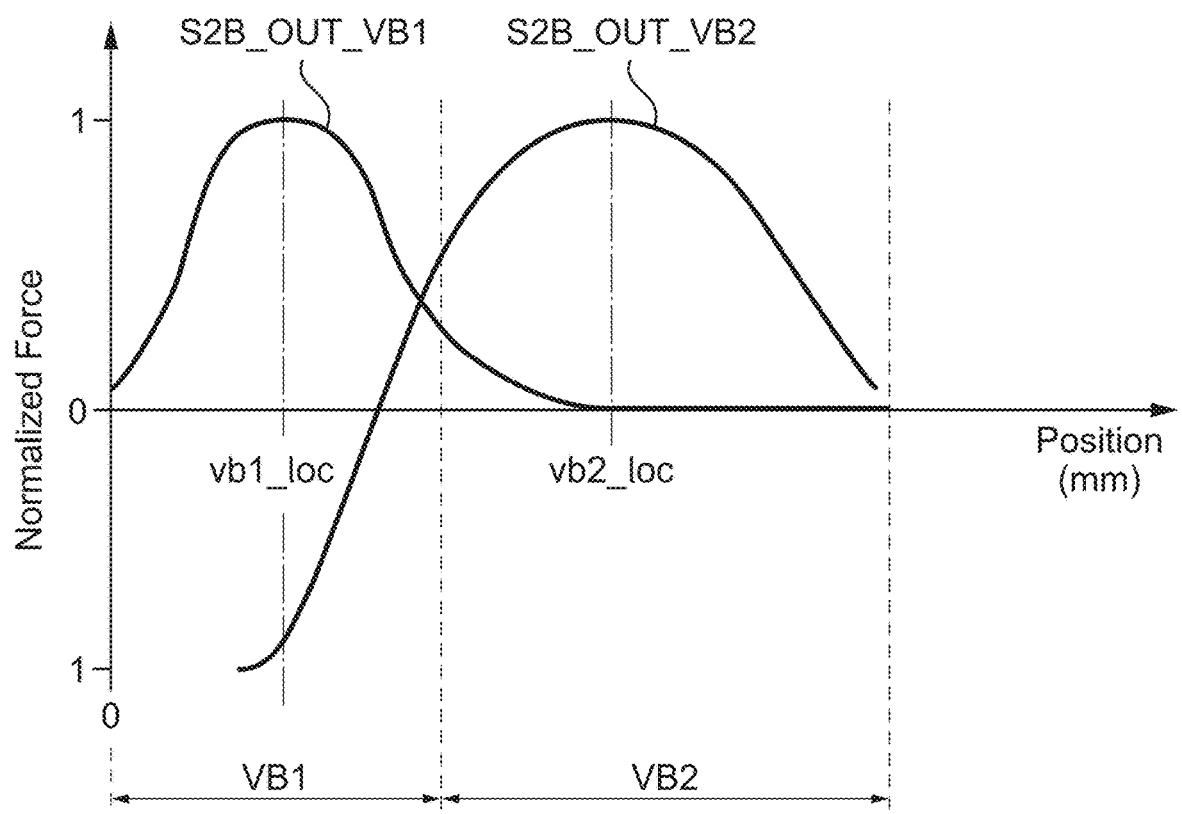

For example, reference is made to FIG. 11B, which is a graph similar to that of FIG. 11A showing an example normalised virtual button force for virtual button VB1 after sensor-to-button mapping, denoted S2B_OUT_VB1, and also showing an example normalised virtual button force for virtual button VB2 after sensor-to-button mapping, denoted S2B_OUT_VB2. Again, the x-axis represents position on the input region 105 in millimetres and the y-axis represents normalised force.

The vertical dashed lines again represent desired boundaries of example virtual buttons VB1 and VB2, as indicated below the graph. Note that these boundaries are slightly different from those shown in FIG. 11A, simply to clarify that the boundaries can be set dependent on the use-case definition.

Also indicated on the graph are the positions of central locations of the virtual buttons VB1 and VB2, namely vb1_loc and vb2_loc, respectively. The level of S2B_OUT_VB1 at the central location vb1_loc may thus be denoted S2B_OUT_VB1(vb1_loc), for example.

When force is administered directly over both of virtual buttons VB1 and VB2 simultaneously, i.e. at vb1_loc and vb2_loc, their force contributions effectively add up and may cancel out. For example, looking at the graph, S2B_OUT_VB1(vb1_loc)=1 and S2B_OUT_VB1 (vb2_loc)=0. However, S2B_OUT_VB2(vb2_loc)=1 and S2B_OUT_VB2(vb1_loc)=−1 (i.e. is negative).

A simultaneous-press cost function CF_SP could be provided to impose two conditions, namely equal forces over VB1 and VB2, and normalised forces of 1 over VB1 and VB2. For example, consider:

$$CF\_SP = |VB1f - VB2f| + |VB1f + VB2f - 2|$$

where VB1f and VB2f are the forces mapped to virtual buttons VB1 and VB2, respectively, when pressing at the locations vb1_loc and vb2_loc simultaneously. In this way, the S2B mapping may be adjusted (which would adjust the traces for S2B_OUT_VB1 and/or S2B_OUT_VB2) to iteratively minimise the cost function CF_SP. When CF_SP=0, the traces for S2B_OUT_VB1 and S2B_OUT_VB2 may for example look similar to those in FIG. 11C, which shows a graph corresponding to that of FIG. 11B. That is, when this cost function has been minimised in practice it works to reduce the negative contributions of each virtual button on the area of the other virtual button.

As another concrete example, the use-case definition may define that the maximum normalized force for each of the M virtual buttons to tend towards a common defined value, such as the value 1. The method 500 may thus comprise generating the mapping to cause the maximum normalized force for each of the M virtual buttons to tend towards the common defined value by adjusting the mapping to reduce or minimise a normalized-force cost function (being a use-case cost function defined by the use-case definition) which defines the effect of the mapping on maximum normalized force.

For example, a normalized-force cost function CF_NF_VB1 for VB1, taking VB1 as an example, may be:

$$CF\_NF\_VB1 = 1 - \max(VB1)$$

where max(VB1) is the maximum value of S2B_OUT_VB1 (where S2B_OUT_VB1 is plotted with normalized values) within the area of the virtual button VB1. In this way, the S2B mapping may be adjusted to iteratively minimise the cost function CF_NF_VB1 aiming for CF_NF_VB1=0. Similar cost functions could be defined for other virtual buttons, and combined such cost functions could also be provided (also referred to as a normalized-force cost function).

Of course, it may be that the use-case definition defines all, any two or all three of the above concrete performance metrics as being important. Thus, the method may comprise generating the mapping to reduce or minimize a combination of at least two of the cross-talk cost function, the simultaneous-press cost function and the normalized-force cost function.

Figure 12:
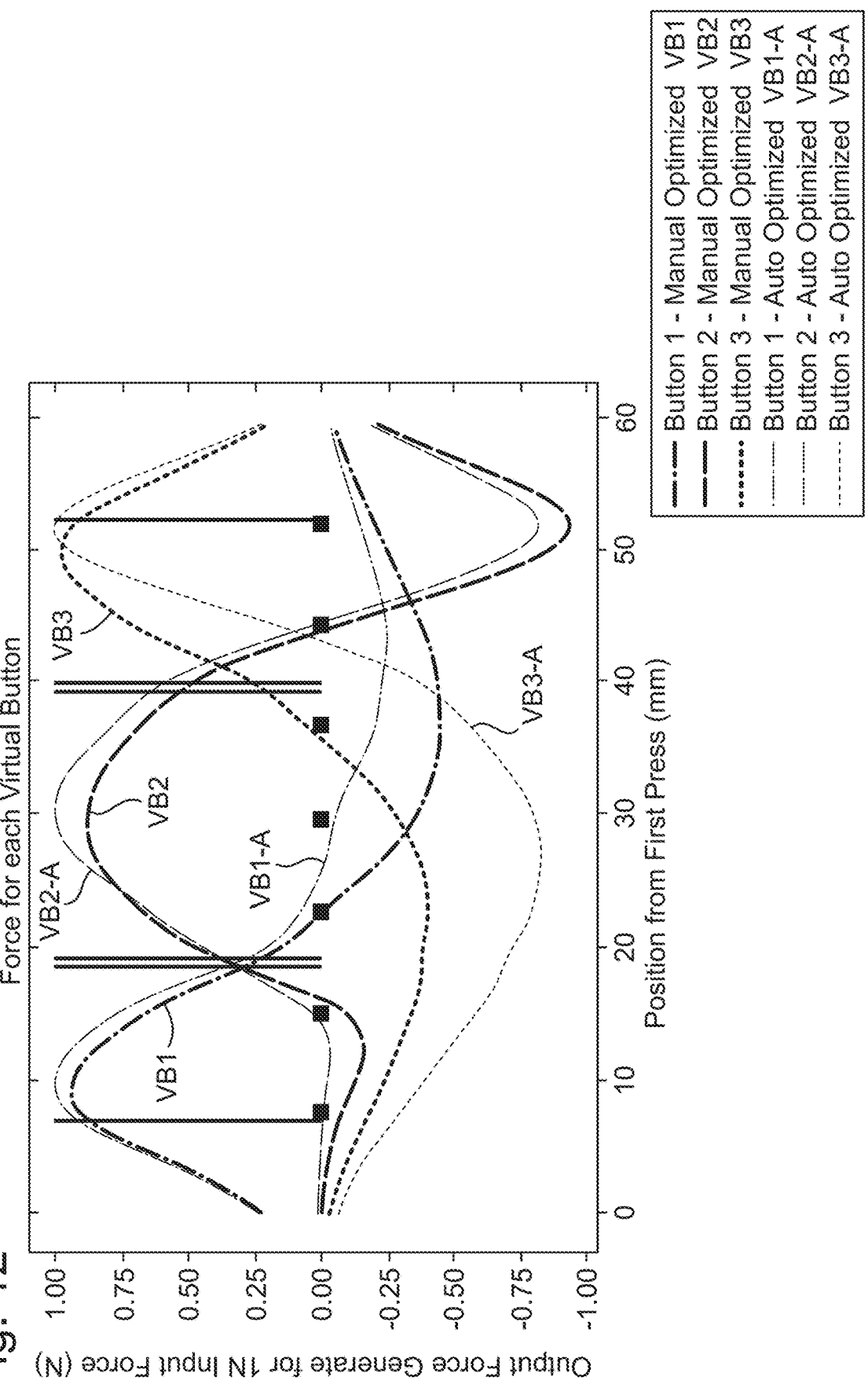
FIG. 12 is a graph corresponding to that of FIG. 10, but showing two sets of traces.

FIG. 12 is a graph corresponding to that of FIG. 10, but showing two sets of traces for the three virtual buttons, VB1, VB2, and VB3.

One of the sets shows traces (with solid lines, and labelled VB1, VB2, and VB3) generated by manually attempting to optimize the mapping (e.g. weights of the S2B matrix) to minimize cross-talk between the M virtual buttons, promote detection of simultaneous pressing of two of the M virtual buttons, and aim for the maximum normalized force for each of the M virtual buttons to have the value 1.

The other one of the sets shows traces (with dashed lines, and labelled VB1-A, VB2-A, and VB3-A) generated by attempting to optimize by calculation the mapping (e.g. weights of the S2B matrix) again to minimize cross-talk between the M virtual buttons, promote detection of simultaneous pressing of two of the M virtual buttons, and aim for the maximum normalized. In this case the cost functions described above were used rather than resorting to manual attempts (effectively trial by error).

It can be seen from FIG. 12 that by using the cost functions, a better mapping (in the sense of better meeting the use-case definition) is achieved. Also, by using the cost functions, that mapping may be achieved in a resource and time efficient manner.

Another advantage of generating the configuration definition (e.g. in the form of the S2B matrix) as described herein is that the calculation may take into account that the configuration definition may need to be (memory) efficient in terms of how it is eventually stored in the device 100 to operate it according to the use-case definition.

For example, a device 100 of the defined type may be configured to run in a low power state, referred to as a ROM (read only memory) mode, in which adaptive removal of cross talk may not be possible. In this case, the S2B matrix above may be configured to reduce/remove cross talk by setting its weights accordingly, however in ROM mode there may only be the possibility of storing a limited number of S2B weights due to limitations in OTP (one-time programmable) memory capacity.

As a concrete example, it may be that the configuration definition comprises parameter values (S2B weights) which define the mapping, and that the method comprises generating the mapping based on the one or more use-case cost functions (as described earlier) to maintain the number of non-standard (e.g. non-zero) weight values at or below a threshold number, with the other weights being standard (e.g. zero) weight values. For example, the S2B mapping may be generated with an additional criterion being that only a threshold number (such as 8) of the weights can have non-zero values (with the device 100 understanding that all of the other weights have zero values, and thus not needing them to be stored).

One possible way to approach minimizing or reducing the number of non-zero weights in the S2B matrix is to first generate the S2B matrix with full freedom as to the weight values, e.g. by evaluating one or more cost-functions as described earlier, and then to remove the "least important weight" from the matrix (i.e. set its value to zero) before repeating the process (keeping that zero value) until the number of non-zero weight values drops to an acceptable level. The "least important" weight could for example be considered the weight with the lowest value in absolute terms, or the weight which when zeroed causes the least (or least detrimental) increment of the cost as calculated by evaluating the cost function(s). It may be desirable to also aim for a similar number of non-zero weights per virtual button. Of course, these are just examples.

As with method 400, method 500 may be carried out on computing apparatus, for example on the controller 326. Method 500 may thus be implemented by calculation, such as by using an algorithm. Thus, implementations may comprise computing apparatus configured to carry out method 500, and corresponding computer programs and computer-readable storage media.

Turning next to method 600, i.e. configuring a candidate device 100 of type X for a given use case defined by a use-case definition, the method 600 comprises obtaining a configuration definition for configuring devices of type X for the given use case, and configuring the candidate device with the configuration definition. A direct product of method 600 may thus be the candidate device 100 once configured with the configuration definition.

The configuration definition may be, or have been, generated by the method 500. For example, the configuration definition may be accessed from storage.

As above, the configuration definition may comprise parameter values, for example weights of the S2B matrix, and the method may comprise configuring the candidate device by setting the parameter values in the candidate device 100. For example, the candidate device 100 may comprise a memory, such as a read-only memory or programmable read-only memory, for storing the parameter values, and the method may comprise configuring the candidate device by storing the parameter values in the memory.

Turning next to methods 700 and 800, i.e. assessing or calibrating a candidate device of type X, the methods comprise performing at least one measurement operation on the candidate device, the measurement operation comprising applying a defined force at a given location 106 on its input region 105 and recording test data for the candidate device and that location based on the sensor signal of at least one of the N force sensors 130 of the candidate device. The candidate device is then assessed or calibrated based on the test data and at least one of a characterization definition for devices of type X (e.g. obtained by method 400) and a configuration definition for devices of type X (e.g. obtained by method 500).

Figure 13:
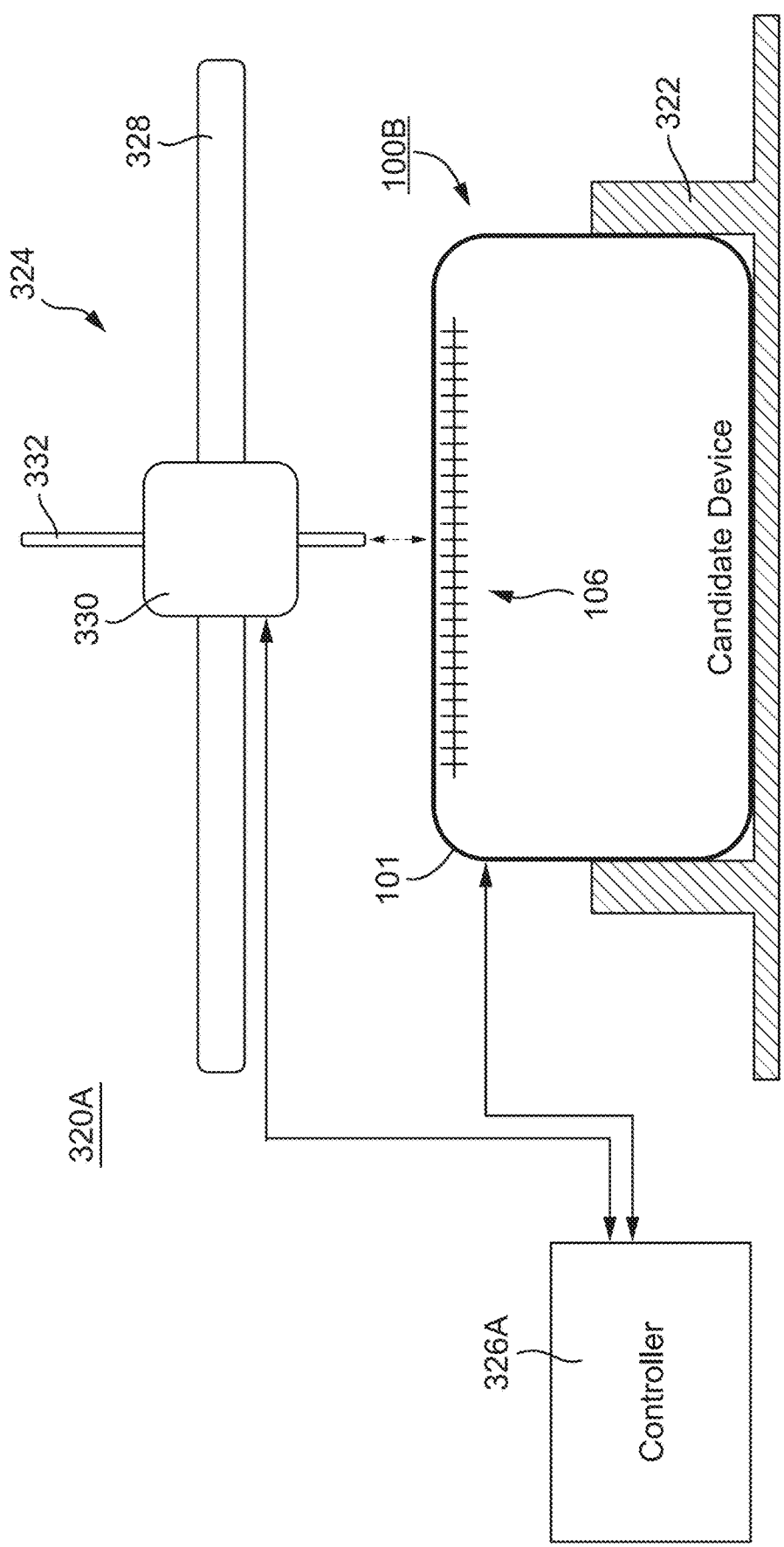
FIG. 13 is a schematic diagram of example measurement apparatus which may be used to implement two of the techniques of FIG. 5.

Reference is made to FIG. 13, which is a schematic diagram of example measurement apparatus 320A which may be used to implement method 700 or 800. The measurement apparatus 320A is the same as the measurement apparatus 320 except that the controller 326 is replaced with the controller 326A, and as such duplicate description is omitted. Also, the specimen device 100A (used for characterization) is replaced with a candidate device 100B, i.e. an instance of device 100 of type X intended to be assessed or calibrated.

The controller 326A is configured to control the actuator 330 and receive sensor signals from its N force sensors 130 (not shown), and in particular to perform at least one measurement operation on the candidate device 100B. As indicated in FIG. 13, a defined force may be applied at a given location on its input region 105, and test data recorded for that location based on the sensor signal of at least one of the N force sensors 130 (not shown) of the candidate device.

Under control by the controller 326A, the actuator 300 aligns the plunger 332 with one of the discrete locations along the input region 105 and applies a known (given or defined) force (i.e. a press) to that location on the input region 105 whilst the N force sensors 130 (not shown) generate respective sensor signals which are received by the controller 326A. Of course, the functionalities of the controllers 326 and 326A may be provided in a single controller.

Figure 14B:
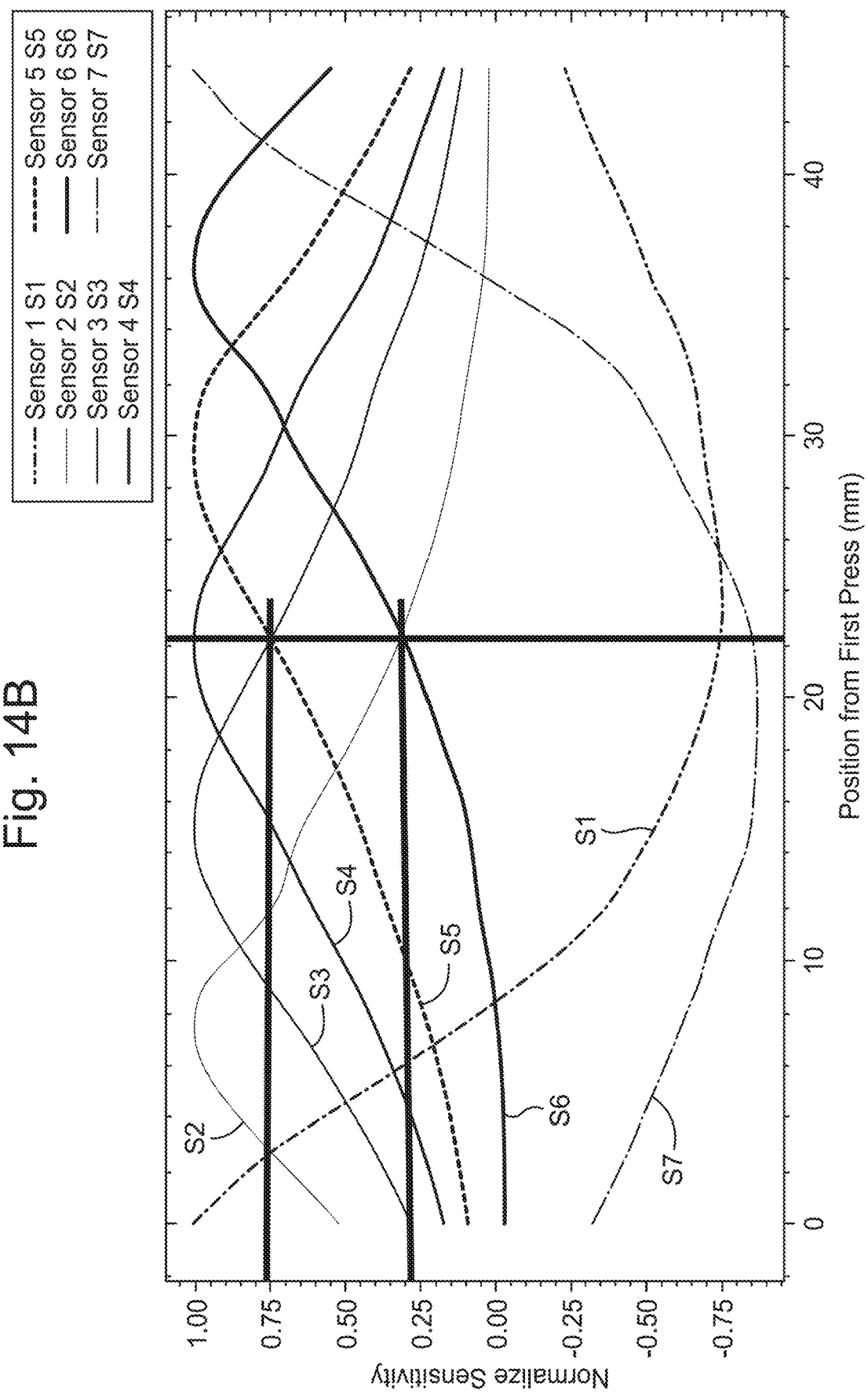

Reference is made to FIGS. 14A and 14B which present two graphs each corresponding to that of FIG. 7, useful for understanding the methods 700 and 800.

The characterization definition for devices of type X (e.g. obtained by method 400) can be used, as an example, to perform 1-shot tuning (derivation of sensor sensitivities using 1 press location) as a form of assessment and/or calibration. This assumes that the characterization definition (characterization function) for type X is predetermined or known (e.g. obtained by method 400) and applies to the device being assessed and/or calibrated.

If a known force is applied in a known location, for example over sensor S4 (the middle sensor) as in the graph of FIG. 14A, it is possible to directly calculate the sensitivity because the peak voltage for that sensor S4 can be obtained. To estimate the peak force on the remaining sensors the characterization definition can be used. This is demonstrated in the graph of FIG. 14B, where the intersections with the traces for sensors S2, S3, S5 and S6 are indicated. For example, the peak voltage on sensor S3 would be estimated by the voltage recorded at the measurement location for sensor S4, divided by 0.75. This is because the trace for sensor S3 is at 0.75 at the measurement location. Once the peak forces have been obtained for the sensors, the resulting sensitivities can be calculated. Calibration of the candidate device 100B may then be performed, e.g. by adjusting parameter values, based on these results.

This idea can be extended to calculate the peak forces at all sensors for any position as long as there is alignment between the discrete locations 106 on the candidate device 100B and the characterization definition, i.e. alignment between how the candidate device 100B is tested and how the characterization definition was generated from one or more specimen devices 100A. This form of assessment can also be applied to reject devices which seem to be outliers if the intersections at the measurement location are outside a threshold of acceptability (e.g. determined statistically through characterization of many specimen devices 100A initially).

In summary, there is disclosed herein a method of recording measurement data for characterizing a response of a given type of device to an applied force, the given type (e.g. type X) defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising: for a specimen device of the given type, performing at least one measurement procedure, each measurement procedure comprising at least one measurement operation, each measurement operation comprising applying a defined force at a corresponding location on the input region of the device concerned and recording measurement data for that device and location based on the sensor signals of the N force sensors of that device. Also disclosed are a related computer-implemented method of generating a characterization definition for devices of the given type, a computer-implemented method of generating a configuration definition for devices of the given type for a given use case defined by a use-case definition, a method of configuring a candidate device of the given type for the given use case, and a method of assessing or calibrating a candidate device of the given type.

The skilled person will recognise that the force sensors referred to herein are an example type of sensor, and that the techniques described herein may be applied to sensor systems having sensors in general. As such, references to a force sensor may be replaced by references to a sensor or to an electrical or electronic sensor or to an input transducer.

The skilled person will recognise that some aspects of the above described apparatus (circuitry) and methods may be embodied as processor control code, for example on a non-volatile carrier medium such as a disk, CD- or DVD-ROM, programmed memory such as read only memory (Firmware), or on a data carrier such as an optical or electrical signal carrier. For example, the controller 326 or 326A may be implemented as a processor operating based on processor control code. As another example, the controller 110 may be implemented as a processor operating based on processor control code.

For some applications, such aspects will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog TM or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware.

Some embodiments of the present invention may be arranged as part of an audio processing circuit, for instance an audio circuit (such as a codec or the like) which may be provided in a host device as discussed above. A circuit or circuitry according to an embodiment of the present invention may be implemented (at least in part) as an integrated circuit (IC), for example on an IC chip. One or more input or output transducers (such as a force sensor 130) may be connected to the integrated circuit in use.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office (USPTO) and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The present disclosure extends to the following statements which are useful for understanding embodiments:

A.

A1. A method of recording measurement data for characterizing a response of a given type of device to an applied force, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising:

for a specimen device of the given type, performing at least one measurement procedure, each measurement procedure comprising at least one measurement operation, each measurement operation comprising applying a defined force at a corresponding location on the input region of the device concerned and recording measurement data for that device and location based on the sensor signals of the N force sensors of that device.

A2. The method according to statement A1, wherein N≥2, and preferably N≥4 such as N=7, and preferably N≥8.

A3. The method according to statement A1 or A2, wherein each measurement procedure comprises P measurement operations, where P≥2, the respective locations for the P measurement operations on the input region of the device concerned being different from one another.

A4. The method according to statement A3, wherein:
P≥X.N and X≥1, and preferably X≥2, and preferably X≥4, and preferably X≥10; or 50≥P≥150; or
the different locations are Y millimetres apart from one another, where 0.1≥Y≥1.

A5. The method according to statement A3 or A4, wherein the corresponding locations for the P measurement operations are:
distributed across the input region of the device concerned, optionally regularly, evenly or irregularly; and/or
defined relative to an external profile of the device concerned, or relative to a reference location on the device concerned defined for the given type, or relative to the input region of the device concerned.

A6. The method according to any of statements A1 to A5, wherein:
N≥2; and
in the defined arrangement:
the N force sensors are arranged in a linear arrangement and the input region is a linear region aligned with the linear arrangement, optionally wherein the linear arrangement defines a straight or curved line; or
the N force sensors are arranged in a 2D arrangement and the input region is a 2D region aligned with the 2D arrangement, optionally wherein the 2D arrangement defines a regular or irregular 2D array of force sensors.

A7. The method according to any of statements A1 to A6, wherein, for each measurement operation, the defined force is applied at the corresponding location for a defined period of time.

A8. The method according to any of statements A1 to A7, wherein, for each measurement operation, the recorded measurement data comprises at least one value for each of the N force sensors based on the sensor signals concerned.

A9. The method according to statement A8, wherein, for each measurement operation, the at least one value comprises a value representative of an amplitude of the sensor signal concerned, optionally of a maximum or average amplitude of the sensor signal concerned.

A10. The method according to any of statements A1 to A9, wherein the method comprises:
for the specimen device, performing a plurality of said measurement procedures; and
generating the characterization definition based on the measurement data of the plurality of measurement procedures, optionally based on average measurement data obtained by averaging the measurement data on a per measurement operation or per location basis over the plurality of measurement procedures.

A11. The method according to any of statements A1 to A10, wherein the method comprises:
performing at least one measurement procedure for a plurality of specimen devices of the given type; and
generating the characterization definition based on the measurement data for the plurality of specimen devices, optionally based on average measurement data obtained by averaging the measurement data on a per measurement operation or per location basis over the plurality of measurement procedures.

A12. The method according to any of statements A1 to A11, wherein the method comprises performing each measurement procedure using a computer-controlled machine.

B.

B1. A computer-implemented method of generating a characterization definition which defines a response of a given type of device to an applied force, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising:
obtaining recorded measurement data for devices of that type; and
generating the characterization definition based on the recorded measurement data.

B2. The method according to statement B1, the recorded measurement data recorded by the method of any of statements A1 to A12 or being corresponding synthetic data.

B3. The method according to statement B1 or B2, wherein generating the characterization definition comprises generating a characterization function per force sensor of the N force sensors, each characterization function defining a relationship between input region location and sensitivity of the force sensor concerned.

B4. The method according to statement B3, comprising generating each characterization function as a discrete or continuous function.

B5. The method according to statement B3 or B4, comprising, where N≥2, generating the characterization functions as normalized characterization functions.

B6. The method according to any of statements B1 to B5, wherein generating the characterization definition comprises generating cross-talk information by determining from the recorded measurement data, for at least one of the N force sensors where N≥2, a magnitude of the sensor signal for each other force sensor of the N force sensors at an input region location where the sensor signal for the force sensor concerned has its maximum value.

B7. The method according to any of statements B1 to B6, comprising generating the characterization definition based on the recorded measurement data by calculation, such as by using an algorithm.

B8. Computing apparatus configured to carry out the method of any of statements B1 to B7.

B9. A computer program which, when executed on computing apparatus, causes the computing apparatus to carry out the method of any of statements B1 to B7.

B10. A computer-readable storage medium having the computer program of statement B9 stored thereon.

C.

C1. A computer-implemented method of generating a configuration definition for configuring a given type of device for a given use case defined by a use-case definition, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising:

obtaining a characterization definition for devices of that type; and generating the configuration definition based on the characterization definition and the use-case definition.

C2. The method according to statement C1, the characterization definition generated by the method of any of statements B1 to B7.

C3. The method according to statement C1 or C2, wherein generating the configuration definition comprises generating cross-talk information by determining from the characterization definition, for at least one of the N force sensors where N≥2, a magnitude of the sensor signal for each other force sensor of the N force sensors at an input region location where the sensor signal for the force sensor concerned has its maximum value.

C4. The method according to any of statements C1 to C3, comprising generating the configuration definition based on the characterization definition and the use-case definition by calculation, such as by using an algorithm.

C5. The method according to any of statements C1 to C4, wherein:

the use-case definition defines M virtual buttons, where M≥1, each virtual button corresponding to a respective portion of the input region; and the configuration definition defines a mapping between the N force sensors and the M virtual buttons, such as between the sensor signals of the N force sensors and button signals of the M virtual buttons.

C6. The method according to statement C5, wherein the use-case definition defines, for each virtual button, its corresponding portion of the input region.

C7. The method according to statement C5 or C6, wherein:

the characterization definition defines a first relationship between input region location and sensitivities of the N force sensors;

the use-case definition defines a specification for a second relationship between input region location and desired sensitivities of the M virtual buttons; and the mapping maps the first relationship to a second relationship which meets said specification.

C8. The method according to any of statements C5 to C7, comprising generating the mapping based on information defining locations of the N sensors relative to the input region or respective portions of the input region corresponding to the M virtual buttons.

C9. The method according to any of statements C5 to C8, comprising generating the mapping, optionally by iteration, based on one or more use-case cost functions each defining an effect of the mapping on one or more performance metrics which measure performance of the device concerned against the use-case definition.

C10. The method according to statement C9, comprising generating the mapping to reduce, minimize, increase or maximize at least one use-case cost function or a combination of at least two use-case cost functions.

C11. The method according to statement C9 or C10, comprising generating the mapping to:

reduce or minimize cross-talk between the M virtual buttons, where M≥2, by adjusting the mapping to reduce or minimise a cross-talk cost function being a use-case cost function which defines an effect of the mapping on cross-talk between the M virtual buttons;

assist detection of simultaneous pressing of two of the M virtual buttons, where M≥2, by adjusting the mapping to reduce or minimise a simultaneous-press cost function being a use-case cost function which defines an effect of the mapping on simultaneous-press detection of two of the M virtual buttons; and/or cause the maximum normalized force for each of the M virtual buttons to tend towards a common defined value, where M≥2, by adjusting the mapping to reduce or minimise a normalized-force cost function being a use-case cost function which defines the effect of the mapping on maximum normalized force for each of the M virtual buttons.

C12. The method according to statement C11, comprising generating the mapping to reduce or minimize a combination of at least two of the cross-talk cost function, the simultaneous-press cost function and the normalized-force cost function.

C13. The method according to any of statements C9 to C12, wherein:

the configuration definition comprises parameter values which define the mapping;

the parameter values comprise standard parameter values defined for the given type of device and non-standard parameter values not defined for the given type of device; and the method comprises generating the mapping based on the one or more use-case cost functions to maintain the number of non-standard parameter values at or below a threshold number of non-standard parameter values.

C14. The method according to any of statements C5 to C13, wherein the use-case definition defines boundaries of portions of the input region corresponding to the M virtual buttons, optionally wherein, where M≥2, the portions of the input region corresponding to the M virtual buttons are non-overlapping portions of the input region and preferably adjoining portions of the input region.

C15. Computing apparatus configured to carry out the method of any of statements C1 to C14.

C16. A computer program which, when executed on computing apparatus, causes the computing apparatus to carry out the method of any of statements C1 to C14.

C17. A computer-readable storage medium having the computer program of statement C16 stored thereon.

D.

D1. A method of configuring a candidate device of a given type for a given use case defined by a use-case definition, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising:

obtaining a configuration definition for configuring devices of the given type for the given use case; and configuring the candidate device with the configuration definition.

D2. The method according to statement D1, the configuration definition generated by the method of any of statements C1 to C14.

D3. The method according to statement D1 or D2, wherein the configuration definition comprises parameter values, the method comprising configuring the candidate device by setting the parameter values in the candidate device.

D4. The method according to statement D3, wherein the given type defines devices of that type as comprising a memory, such as a read-only memory or programmable read-only memory, for storing the parameter values, the method comprising configuring the candidate device by storing the parameter values in the memory.

E.

E1. A method of assessing or calibrating a candidate device of a given type, the given type defining devices of that type as comprising a defined arrangement of a surface and N force sensors of the device concerned, where N≥1, each force sensor configured to output a sensor signal, wherein in the defined arrangement the N force sensors are operatively coupled to a defined input region of the surface so as to sense a force applied to that input region, the method comprising:
performing at least one measurement operation on the candidate device, the measurement operation comprising applying a defined force at a given location on its input region and recording test data for the candidate device and that location based on the sensor signal of at least one of the N force sensors of the candidate device; and
assessing or calibrating the candidate device based on the test data and at least one of:
a characterization definition for devices of that type; and
a configuration definition for devices of that type.

E2. The method according to statement E1, the characterization definition generated by the method of any of statements B1 to B7 and/or the configuration definition generated by the method of any of statements C1 to C14.

E3. The method according to statement E1 or E2, comprising adjusting one or more parameters of the candidate device or determining that the candidate device does not meet a performance requirement defined for the given type based on the test data and at least one of the characterization definition and the configuration definition.

E4. The method according to any of statements E1 to E3, comprising:
calculating sensitivities of one or more of the N force sensors of the candidate device based on the test data and the characterization definition;
comparing the calculated sensitivities to corresponding sensitivities of one or more of the N force sensors defined by the characterization definition; and
adjusting one or more parameters of the candidate device, or determining that the candidate device does not meet a performance requirement defined for the given type, based on the comparison.

E5. The method according to any of statements E1 to E4, comprising assessing or calibrating the candidate device by calculation, such as by using an algorithm, optionally using a computer.

E6. The method according to any of statements E1 to E5, wherein the method comprises performing each measurement operation using a computer-controlled machine.

The invention claimed is:

1. A computer-implemented method of generating a configuration definition for configuring a given type of device for a given use case defined by a use-case definition, the given type defining devices of that type as comprising a defined arrangement of a surface and N force sensors of the device concerned, where N≥2, each force sensor configured to output a sensor signal, wherein in the defined arrangement the N force sensors are operatively coupled to a defined input region of the surface so as to sense a force applied to that input region, the method comprising:
recording measurement data for devices of the given type by:
for a specimen device of the given type, performing at least one measurement procedure, each measurement procedure comprising at least one measurement operation, each measurement operation comprising applying a defined force at a corresponding location on the input region of the device concerned and recording measurement data for that device and location based on the sensor signals of the N force sensors of that device,
wherein each measurement procedure comprises P measurement operations, where P≥2, the respective locations for the P measurement operations on the input region of the device concerned being different from one another,
wherein the corresponding locations for the P measurement operations are distributed across the input region of the device concerned, and
wherein the method comprises performing each measurement procedure using a computer-controlled machine;
generating a characterization definition for devices of that type based on the recorded measurement data, wherein the characterization definition defines a response of devices of the given type to an applied force, and wherein generating the characterization definition comprises, based on the recorded measurement data, generating a characterization function per force sensor of the N force sensors, each characterization function defining a relationship between input region location and sensitivity of the force sensor concerned; and
generating the configuration definition based on the characterization definition and the use-case definition,
wherein generating the configuration definition comprises generating cross-talk information by determining from the characterization definition, for at least one of the N force sensors, a magnitude of the sensor signal for each other force sensor of the N force sensors at an input region location where the sensor signal for the force sensor concerned has its maximum value.

2. The method according to claim 1, wherein:
the use-case definition defines M virtual buttons, where M≥1, each virtual button corresponding to a respective portion of the input region; and
the configuration definition defines a mapping between the N force sensors and the M virtual buttons, such as between the sensor signals of the N force sensors and button signals of the M virtual buttons.

3. The method according to claim 2, comprising generating the mapping based on information defining locations of the N sensors relative to the input region or respective portions of the input region corresponding to the M virtual buttons.

4. The method according to claim 2, comprising generating the mapping based on one or more use-case cost functions each defining an effect of the mapping on one or more performance metrics which measure performance of the device concerned against the use-case definition.

5. The method according to claim 4, comprising generating the mapping to reduce, minimize, increase or maximize at least one use-case cost function or a combination of at least two use-case cost functions.

6. The method according to claim 4, comprising generating the mapping to:
reduce or minimize cross-talk between the M virtual buttons, where M≥2, by adjusting the mapping to reduce or minimise a cross-talk cost function being a use-case cost function which defines an effect of the mapping on cross-talk between the M virtual buttons;

assist detection of simultaneous pressing of two of the M virtual buttons, where M≥2, by adjusting the mapping to reduce or minimise a simultaneous-press cost function being a use-case cost function which defines an effect of the mapping on simultaneous-press detection of two of the M virtual buttons; and/or cause a maximum normalized force for each of the M virtual buttons to tend towards a common defined value, where M≥2, by adjusting the mapping to reduce or minimise a normalized-force cost function being a use-case cost function which defines the effect of the mapping on the maximum normalized force for each of the M virtual buttons.

7. The method according to claim 4, wherein:
the configuration definition comprises parameter values which define the mapping;
the parameter values comprise standard parameter values defined for the given type of device and non-standard parameter values not defined for the given type of device; and
the method comprises generating the mapping based on the one or more use-case cost functions to maintain the number of non-standard parameter values at or below a threshold number of non-standard parameter values.

8. The method according to claim 4, wherein the use-case definition defines boundaries of portions of the input region corresponding to the M virtual buttons.

9. A method of configuring a candidate device of a given type for a given use case defined by a use-case definition, the given type defining devices of that type as comprising a defined arrangement of a surface and N force sensors of the device concerned, where N≥2, each force sensor configured to output a sensor signal, wherein in the defined arrangement the N force sensors are operatively coupled to a defined input region of the surface so as to sense a force applied to that input region, the method comprising:
obtaining a configuration definition for configuring devices of the given type for the given use case, the configuration definition generated by the method of claim 1; and
configuring the candidate device with the configuration definition.

10. A method of assessing or calibrating a candidate device of a given type, the given type defining devices of that type as comprising a defined arrangement of a surface and N force sensors of the device concerned, where N>2, each force sensor configured to output a sensor signal, wherein in the defined arrangement the N force sensors are operatively coupled to a defined input region of the surface so as to sense a force applied to that input region, the method comprising:
performing at least one measurement operation on the candidate device, the measurement operation comprising applying a defined force at a given location on its input region and recording test data for the candidate device and that location based on the sensor signal of at least one of the N force sensors of the candidate device; and
assessing or calibrating the candidate device based on the test data and a configuration definition for devices of that type, the configuration definition generated by the method of claim 1.

11. The method according to claim 10, comprising:
calculating sensitivities of one or more of the N force sensors of the candidate device based on the test data and the characterization definition;
comparing the calculated sensitivities to corresponding sensitivities of one or more of the N force sensors defined by the characterization definition; and
adjusting one or more parameters of the candidate device, or determining that the candidate device does not meet a performance requirement defined for the given type, based on the comparison.

12. A computer-implemented method of generating a configuration definition for configuring a given type of device for a given use case defined by a use-case definition, the given type defining devices of that type as comprising a defined arrangement of a surface and N force sensors of the device concerned, where N≥2, each force sensor configured to output a sensor signal, wherein in the defined arrangement the N force sensors are operatively coupled to a defined input region of the surface so as to sense a force applied to that input region, the method comprising:
recording measurement data for devices of the given type by:
for a specimen device of the given type, performing at least one measurement procedure, each measurement procedure comprising at least one measurement operation, each measurement operation comprising applying a defined force at a corresponding location on the input region of the device concerned and recording measurement data for that device and location based on the sensor signals of the N force sensors of that device,
wherein each measurement procedure comprises P measurement operations, where P≥2, the respective locations for the P measurement operations on the input region of the device concerned being different from one another,
wherein the corresponding locations for the P measurement operations are distributed across the input region of the device concerned, and
wherein the method comprises performing each measurement procedure using a computer-controlled machine;
generating a characterization definition for devices of that type based on the recorded measurement data, wherein the characterization definition defines a response of devices of the given type to an applied force, and wherein generating the characterization definition comprises, based on the recorded measurement data, generating a characterization function per force sensor of the N force sensors, each characterization function defining a relationship between input region location and sensitivity of the force sensor concerned; and
generating the configuration definition based on the characterization definition and the use-case definition,
wherein:
the use-case definition defines M virtual buttons, where M≥2, each virtual button corresponding to a respective portion of the input region;
the configuration definition defines a mapping between the N force sensors and the M virtual buttons, such as between the sensor signals of the N force sensors and button signals of the M virtual buttons; and
the method comprises generating the mapping to:
reduce or minimize cross-talk between the M virtual buttons, by adjusting the mapping to reduce or minimise a cross-talk cost function being a use-case cost function which defines an effect of the mapping on cross-talk between the M virtual buttons;

assist detection of simultaneous pressing of two of the M virtual buttons, by adjusting the mapping to reduce or minimise a simultaneous-press cost function being a use-case cost function which defines an effect of the mapping on simultaneous-press detection of two of the M virtual buttons; and/or cause a maximum normalized force for each of the M virtual buttons to tend towards a common defined value, by adjusting the mapping to reduce or minimise a normalized-force cost function being a use-case cost function which defines the effect of the mapping on the maximum normalized force for each of the M virtual buttons.

13. A method of assessing or calibrating a candidate device of a given type, the given type defining devices of that type as comprising a defined arrangement of a surface and N force sensors of the device concerned, where N>2, each force sensor configured to output a sensor signal, wherein in the defined arrangement the N force sensors are operatively coupled to a defined input region of the surface so as to sense a force applied to that input region, the method comprising:

performing at least one measurement operation on the candidate device, the measurement operation comprising applying a defined force at a given location on its input region and recording test data for the candidate device and that location based on the sensor signal of at least one of the N force sensors of the candidate device; and assessing or calibrating the candidate device based on the test data and a configuration definition for devices of that type, the configuration definition generated by the method of claim 12.

* * * * *